US005172415A

United States Patent [19]

Fosgate

[11] Patent Number: 5,172,415

[45] Date of Patent: Dec. 15, 1992

[54] SURROUND PROCESSOR

[76] Inventor: James W. Fosgate, 4750 E. 1200 South, Heber City, Utah 84032

[21] Appl. No.: 533,091

[22] Filed: Jun. 8, 1990

[51] Int. Cl.[5] .......... H04R 5/00; H03G 3/00

[52] U.S. Cl. .......... 381/22; 381/63

[58] Field of Search .......... 381/22, 27, 28, 61, 381/71

[56] References Cited

U.S. PATENT DOCUMENTS

| | | | |
|---|---|---|---|
| 3,632,886 | 1/1972 | Scheiber . | |
| 3,708,631 | 1/1973 | Bauer et al. . | |
| 3,746,792 | 7/1973 | Scheiber . | |
| 3,836,715 | 9/1974 | Ito et al. . | |
| 3,864,516 | 2/1975 | Kameoka et al. . | |
| 3,883,692 | 5/1975 | Tsurushima . | |
| 3,883,832 | 5/1975 | Fosgate . | |
| 3,885,099 | 5/1975 | Tsurushima | 381/22 |
| 3,943,287 | 3/1976 | Gravereaux et al. . | |
| 3,944,735 | 3/1976 | Willcocks . | |
| 3,959,590 | 5/1976 | Scheiber . | |
| 4,704,728 | 11/1987 | Scheiber . | |
| 4,891,839 | 1/1990 | Scheiber . | |
| 4,932,059 | 6/1990 | Fosgate | 381/22 |

*Primary Examiner*—James L. Dwyer
*Assistant Examiner*—Jack Chiang
*Attorney, Agent, or Firm*—David L. McCombs

[57] ABSTRACT

A surround processor includes a time constant processing circuit for smoothing directional information signals from a detector with continuously variable time constants in order to generate one or more control voltage signals. The time constants produced by the circuit are continuously variable and responsive to both the rate of change and the amplitude of the directional information signals, such that as the difference between the controlled voltage signals and the directional information signals increases, the value of the time constants decreases to permit the control voltage signals to closely follow the directional information signals, and as the difference between the control voltage signals and the directional information signals decreases, the value of the time constants increases so that variations in the control voltage signals are smooth. Split-band processing of input audio signals to the processor is also accomplished without the necessity of placing filters directly in the audio path. A low-pass filter is utilized to separate out the low-frequency components of the input signals, and signal-dependent processing occurs with respect to the mid- and upper-frequency components only. Other improvements are also incorporated into the surround processor to optimize its performance.

27 Claims, 7 Drawing Sheets

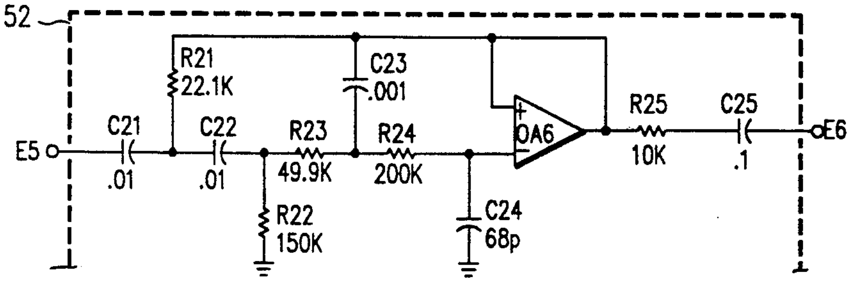
FIG. 3
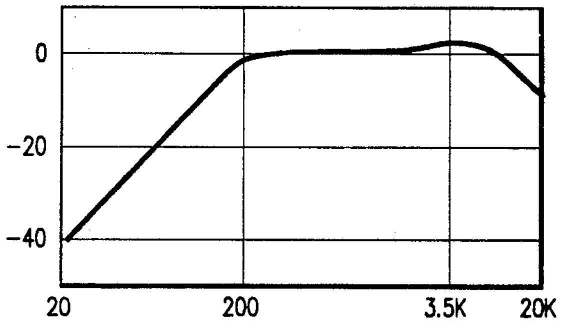
FIG. 4
FIG. 5
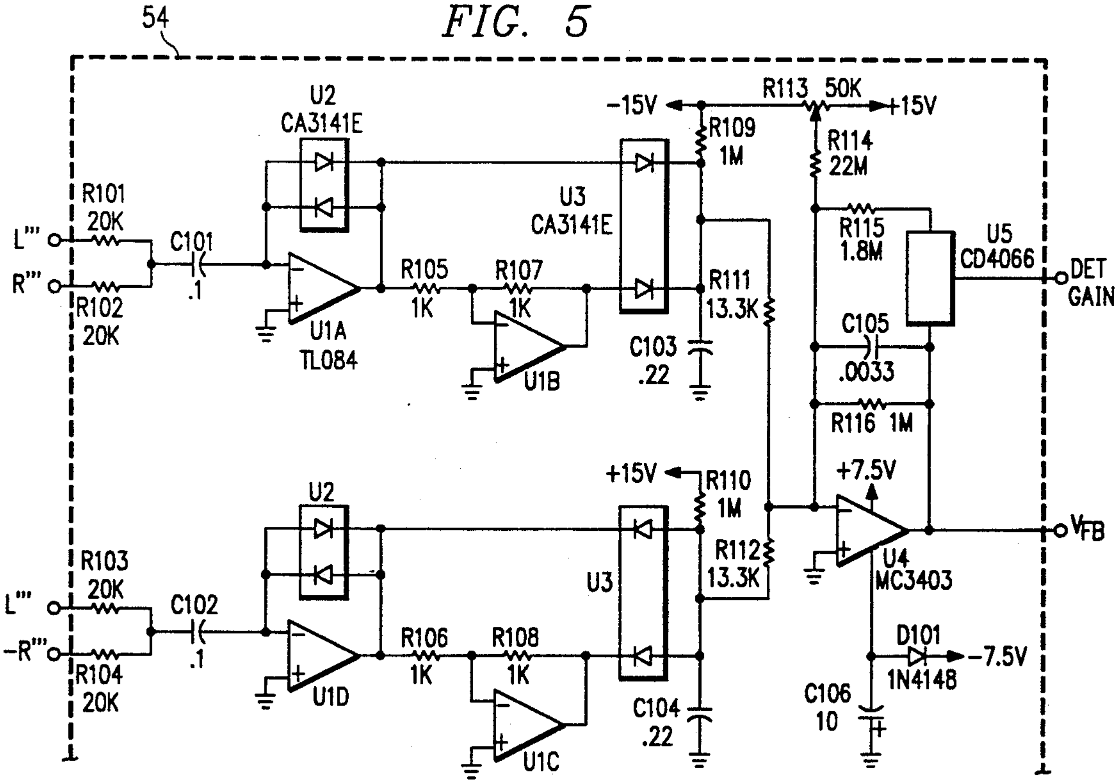

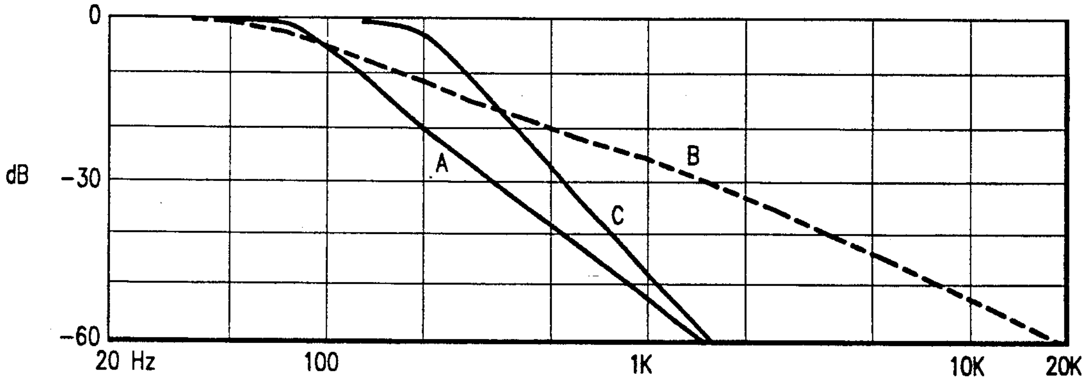
FIG. 10
FIG. 11
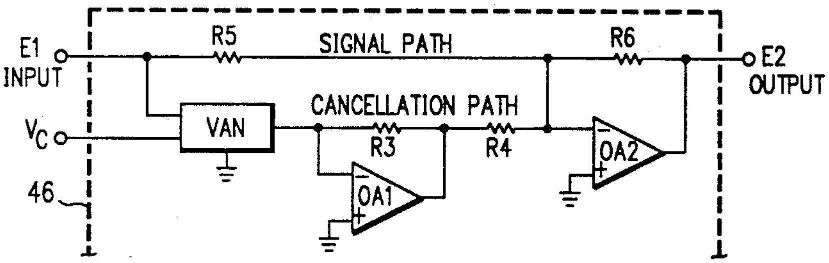
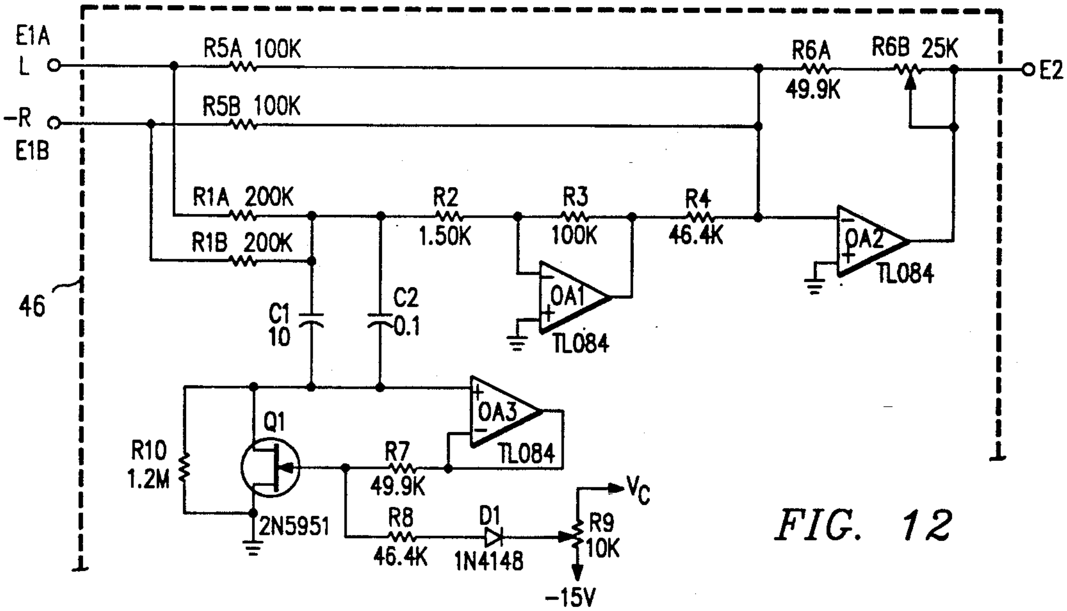
FIG. 12

FIG. 13
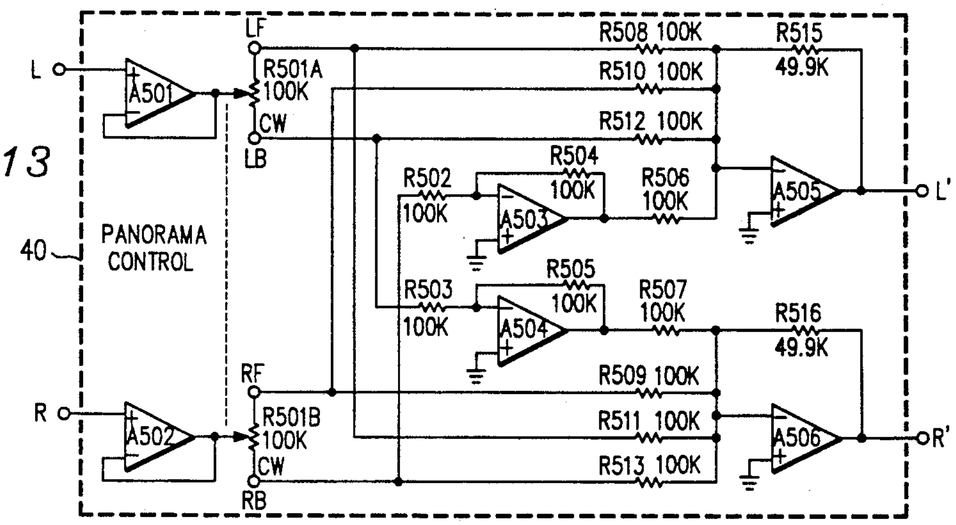
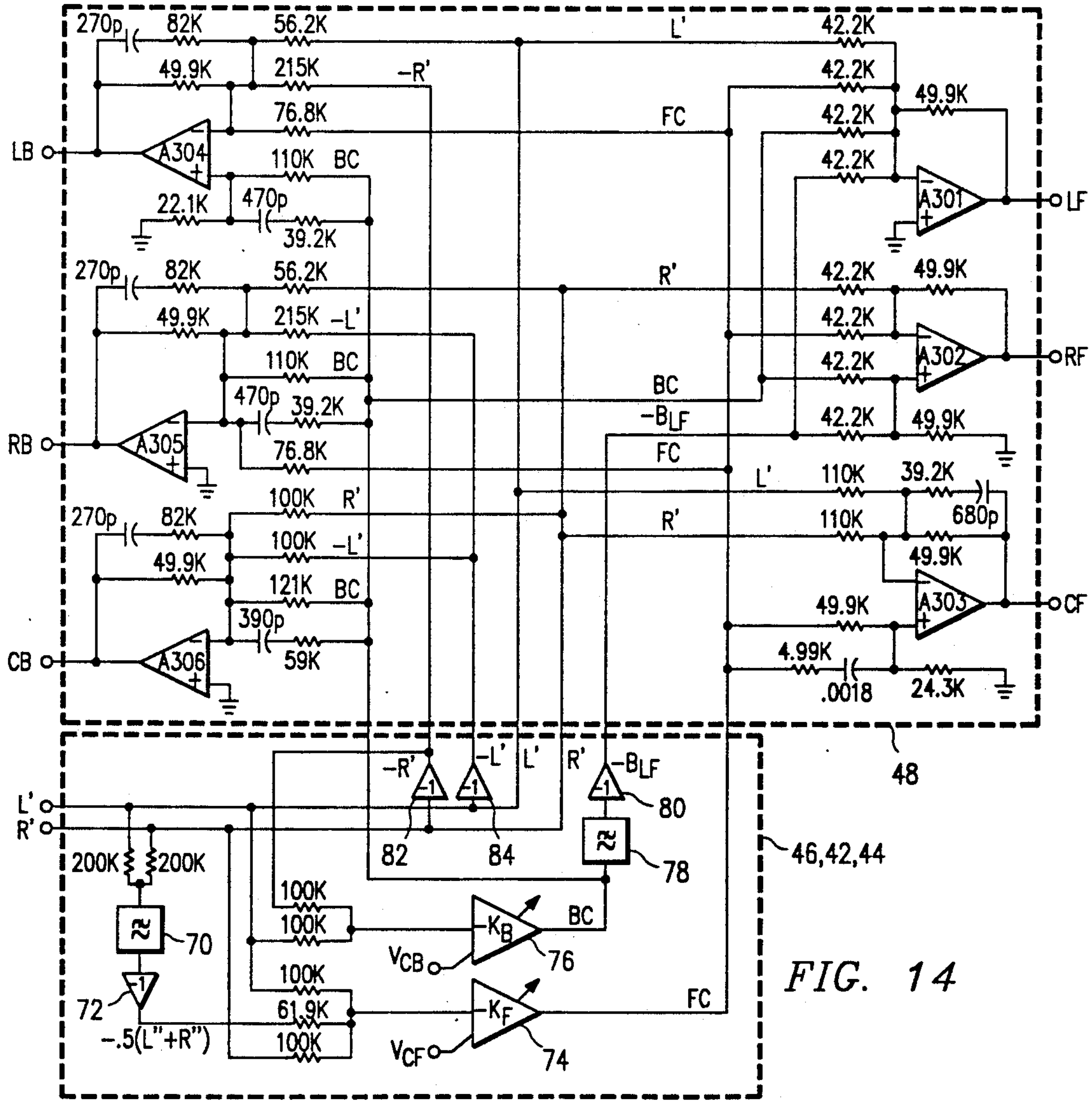
FIG. 14

SURROUND PROCESSOR

TECHNICAL FIELD

The present invention relates in general to processors for the periphonic reproduction of sound. More specifically, the invention relates to an improved variable matrix decoder for multichannel redistribution of audio signals.

BACKGROUND OF THE INVENTION

The basic principle of so-called surround processors is to enhance a two channel stereophonic source signal so as to drive a multiplicity of loudspeakers arranged to surround the listener, in a manner to provide a high-definition soundfield directly comparable to discrete multitrack sources in perceived performance. An illusion of space may thus be created enabling the listener to experience the fullness, directional quality and aural dimension or "spaciousness" of the original sound environment. The foregoing so called periphonic reproduction of sound can be distinguished from the operation of conventional soundfield processors which rely on digitally generated time delay of audio signals to simulate reverberation or "ambience" associated with live sound events. These conventional systems do not directionally localize sounds based on information from the original performance space and the resulting reverberation characteristics are noticeably artificial.

Within the home and commercial entertainment field, extensive research and development has been conducted in the area of surround processors and in particular with regard to decoding apparatus for the decoding of audio signals encoded by phase and amplitude matrixing onto two channels, for transmission or recording using stereophonic media. In multichannel decoding apparatus according to the prior art, there are both fixed matrix decoders and variable matrix decoders. Fixed matrix decoders are those in which a plurality of input signals containing encoded information relating to the directions of sound sources are summed in appropriate proportions and phases to yield a plurality of output signals suitable, after amplification, for driving a corresponding plurality of surrounding loudspeakers in a room, the process being describable in terms of a matrix transformation in which the matrix coefficients are fixed and time invariant. The optimum performance of such decoders occurs when the decoding matrix is the pseudo-inverse of the encoding matrix, and no further improvement in performance is possible unless the coefficients can be varied dynamically.

Variable matrix decoders also matrix a plurality of encoded input signals to produce a plurality of output signals suitable for driving a multichannel loudspeaker system, but the decoding matrix coefficients do not remain fixed. Instead, they are varied by means of a directionally sensing and control system, which continually monitors the correlations in phase and amplitude ratios between the input signals and adjusts the decoding coefficients to provide the maximum possible enhancement of directional cues for the most prominent sound sources at any instant in time. So called "logic steering" or dynamic separation enhancement techniques typical of variable matrix decoders are described in Scheiber, U.S. Pat. No. 3,632,886; Bauer, U.S. Pat. No. 3,708,631; to and Takahashi, U.S. Pat. No. 3,836,715; Kameoka et al., U.S. Pat. No. 3,864,516; Tsurushima, U.S. Pat. No. 3,883,692; Gravereaux et al., U.S. Pat. No. 3,943,287; Willcocks, U.S. Pat. No. 3,944,735; and Scheiber, U.S. Pat. No. 4,704,728. While the detailed logic steering circuitry and methods used to implement the variation of decoding matrix coefficients in these and numerous other matrix decoders differ, all of the known decoder systems utilize means for determining from the signals present at their input terminals the predominant components of the soundfield, and then deriving therefrom a number of control signals, which are in turn used to vary gain parameters of the decoder and thereby modify the decoding coefficients to optimize the directional cues in the reproduction of those sounds.

For a well designed decoder system, the control signals and their sum generally behave to provide correct separation, localization and placement of individual predominant sound sources. However, careful attention must also be paid to psychoacoustic performance where the control signals and their corresponding matrix coefficients vary, to ensure a natural perception of sound by the ear-brain combination. Where extreme dynamic conditions cause the control signals to vary quickly to follow all the variations of predominant directionality, the resulting presentation can suffer from an anomaly known as "pumping" or "breathing", since it is clearly obvious when a channel is turned on or off. Other audible problems known by those skilled in the art to occur include intermodulation distortion, mislocalization or apparent wandering of sound sources and modulation of noise or rumble associated with the signals.

Some of the prior art decoder systems have attempted to address the foregoing. Willcocks, U.S. Pat. No. 3,944,735 describes an attack and decay time constant processor section wherein each control signal is stored on a capacitor which is discharged at a variable rate depending upon the relative strength of other control signals present. The "attack" time constants refer to the charging time of each of these capacitors and are always short, so as to generate a fast control signal responsive to the new predominant source. The decay time constants refer to the discharge time of these capacitors and allow the control signal associated with the then predominant sound direction to fall slowly, thus providing a smooth, more realistic sound.

While the provision of a fast attack/slow-decay time constant processing circuit has some benefit, a side effect is that the sum of the control coefficient signals can exceed the optimum level, causing more severe level variations and deterioration of the sharpness of localization under some circumstances. Further, as rapid changes in the predominant source occur, the dynamic separation suffers since the signal that was predominant is still decaying and the effective direction sensed by the logic steering circuitry is different from the actual direction of the predominant source. Thus, where a system is slowed sufficiently to be smooth in all circumstances, it will have inferior separation in response to music with well-defined "attacks" from different encoded directions. Attacks in this sense refer to rapid increases of the audio signal amplitude envelope.

Scheiber, U.S. Pat. No. 4,704,728 describes a method for adjustment of both attack and decay time constants in accordance with overall signal levels and with detected attacks in the signal content, employing a slew-rate limiting technique. However, the slow decay time constants are generally too slow, resulting in smooth but nondefinitive performance. Also, as the signal falls the time constants become even slower, which has been found to be undesirable. The only valid context for this to occur is when the signal to-noise ratio drops to such a level that control signals are mainly being generated in response to random noise. Further, the attack sensing circuitry and associated method of responding to signal attacks does not permit fast control signal variations to occur in a short enough period of time to avoid audible distortion effects and is not controlled to the extent required for optimum performance.

Heretofore unrealized improvements in psychoacoustic performance of such decoder systems would therefore include attack and decay time constants which are continuously variable over a wide range, and varied in response to both the strength of the individual control signal and the rate of change of the control signals occurring prior to the generation of these time constants. The effect would be that audio signal attacks are detected and responded to with very brief periods of shortening of time constants, with longer and smoother time constants restored as soon as the attack demand has been met.

Improvement of the dynamic separation performance of decoders has also been attempted by split band processing. Split band processing allows for improved audio separation and thus improved directional effects since the separation occurs over a smaller audio signal frequency range, as opposed to being averaged over the entire frequency band. The noise and distortion at lower frequencies caused by imperfections in the presentation are also effectively eliminated by band specific processing techniques. However, known split-band surround processors typically employ a filter network for first receiving input signals in the direct audio path and splitting the signals into high and low-frequency bands, which are then processed by two separate decoders, one for the high and one for the low frequency band. The provision of multiple decoders and associated circuitry complicates these arrangements and adds significantly to their cost. Further, the placement of filters in the audio path has a tendency to degrade the audio signal because of the added stages and summing techniques.

SUMMARY OF THE INVENTION

It is therefore an object of the present invention to provide an improved surround processor for the reproduction of sound from a stereophonic source in a manner comparable to a live presentation from multiple sound sources in perceived performance.

It is another object of the present invention to provide a surround processor of the above type which provides faster but smoother and more realistic multichannel redistribution of sound from a stereophonic source.

In accordance with these and other objects, the present invention is directed to a surround processor for the reproduction of stereophonic material on a multiplicity of loudspeakers arranged to surround the listener. A time constant processing circuit is provided for smoothing directional information signals produced by a detector circuit with continuously variable time constants in order to generate one or more control-voltage signals. The circuit is responsive to both the rate of change and the amplitude of the directional information signals, such that as the difference between the control-voltage signals and the directional information signals increases, the value of the time constants decreases to permit the control-voltage signals to closely follow the directional information signals, and as the difference between the control-voltage signals and the directional information signals decreases, the value of the time constants increases so that variations in the control voltage signals are smooth. Thus, the time constants are continously variable so as to permit very rapid and accurate response to sudden audio signal attacks or transient sounds, while maintaining smooth, distortionless performance when such attacks are absent.

In a preferred embodiment of the present invention the time constant processing or servo logic circuit includes a width modulated pulse train applied to an electronic switch which bypasses one of two resistors associated with a capacitor on which the control voltage is stored. The duty cycle of the pulse train is varied in accordance with the difference between the unprocessed control signal and the same signal after time constant processing, so that the effective time constants are reduced in response to rapid changes of the detected sound directional information. Signal attacks are thereby detected and responded to with very brief periods of substantial shortening of time constants, but longer and smoother time constants are restored as soon as the attack demand has been met.

The processor also provides an arrangement for accomplishing split band processing of the input audio signals without the necessity of placing filters directly in the audio path. A low pass filter is utilized to separate out the low-frequency components of the input signals, and signal dependent processing occurs with respect to the mid- and upper-frequency components only. The unprocessed low or bass frequencies of the input signals are then recombined with the resulting processed signals in appropriate proportions for generating the loudspeaker feed signals. In order to process only the desired higher-frequency components, the input audio signals are passed through an improved band-pass filter prior to extraction of directional information.

Additional improvements have been incorporated into the sound processor of the present invention to optimize its performance. For example, noise and distortion of voltage-controlled amplifiers used in the signal dependent variable matrixing means has been substantially reduced by an improved voltage-controlled amplifier arrangement employing a field effect transistor (FET) attenuator in a side chain rather than in the main signal path of the voltage controlled amplifiers. Other improvements include an input processing circuit which provides a variable panorama control, and an improved twin T bass equalizer network.

BRIEF DESCRIPTION OF THE DRAWINGS

The novel features believed characteristic of the present invention are set forth in the appended claims. The invention itself, however, as well as other features and advantages thereof, will best be understood by reference to the following detailed description of an illustrative embodiment when read in conjunction with the accompanying figures, wherein:

FIG. 3 is a detailed schematic diagram of an improved band-pass filter configuration for use in restricting the frequency range of signals applied to the log ratio detector of a split-band surround processor in FIG. 2;

FIG. 4 is a graphical representation of the gain of the filter of FIG. 3 versus frequency;

FIG. 5 is a detailed schematic diagram of a log-ratio detector suitable for use in a processor of FIG. 2;

FIG. 10 is a graphical representation of the level of signals to which fixed matrixing is applied versus frequency in the split-band implementations of the processor according to FIG. 8C employing either a two-pole (curve A) or a three pole (curve C) low-pass filter contrasted with the implementation according to FIG. 8B (curve B);

FIG. 11 is a schematic diagram of a general form of a voltage-controlled amplifier circuit of FIG. 2;

FIG. 12 is a detailed schematic diagram of an embodiment of the voltage-controlled amplifier circuit according to FIG. 11;

FIG. 13 is a detailed schematic diagram of an input signal processing circuit according to the invention to provide a variable panorama control for the processor of FIG. 2.

FIG. 14 is a detailed schematic diagram of an improved output matrix according to the invention for the processor of FIG. 2;

DESCRIPTION OF THE PREFERRED EMBODIMENTS

It will be appreciated that the present invention can take many forms and embodiments. Some embodiments of the invention are illustrated herein for purposes of understanding the invention. The embodiments shown herein are intended to illustrate, and not to limit the invention. In the accompanying drawings, part numbers and values of components are set forth, which components and parts are commercially available at the present time from commercial vendors.

Figure 1:
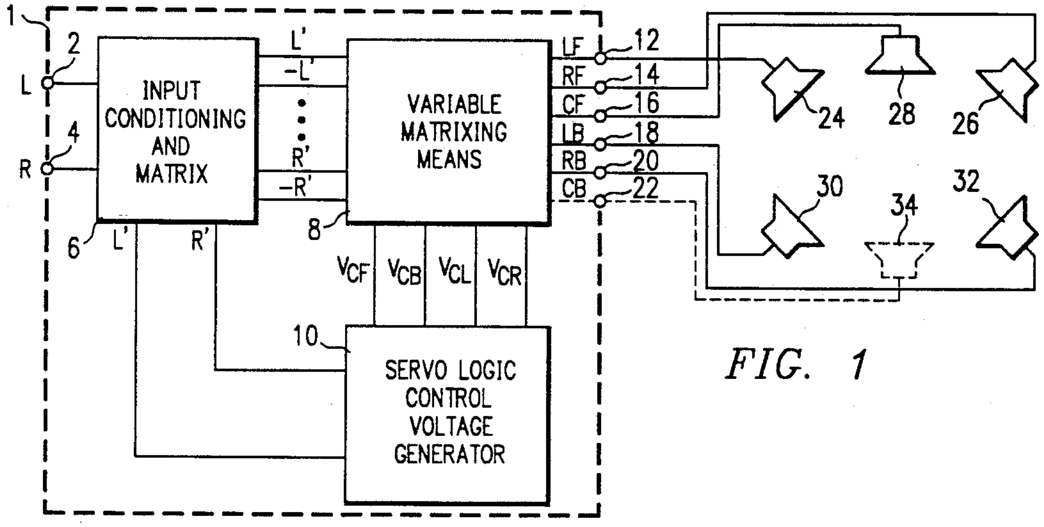
FIG. 1 is a block diagram which illustrates a configuration of a surround processor involving the present invention.

With reference to FIG. 1, there is shown a block diagram of a surround processor 1 embodying features of the present invention having signal input terminals 2 and 4. The processor 1 includes an input conditioning and matrix means 6, a variable matrixing means 8 and a servo logic control voltage generator (CVG) 10. The input terminals 2 and 4 are connected to the input conditioning and matrix means 6 for receiving left (L) and right (R) channel signals, respectively, from a stereophonic source. It is understood that the left and right signals may or may not be encoded in a conventional manner for surround processing.

Six output terminals 12, 14, 16, 18, 20 and 22 are connected to the variable matrixing means 8 for passing directionally enhanced signals processed in accordance with the present invention to respective loudspeakers 24, 26, 28, 30, 32 and 34. The loudspeakers 24–34 may be disposed to surround a listener at left front, right front, center front, left back, right back and center back positions, respectively. The processed output signals received by the loudspeakers 24–34 are designated by the references LF, RF, CF, LB, RB and CB, respectively.

The center back (CB) signal path, the output 22 and the loudspeaker 34 are shown in dashed-line form to indicate that they may be omitted, the center back signal derived in the variable matrixing means 8 then being applied equally to the LB and RB signal channels and the loudspeakers 30 and 32, thus producing a "phantom" center back sound image. Similarly, the center front (CF) signal path, the terminal 16 and the loudspeaker 28 may also be omitted, with the CF signal being applied equally to the left front and right front loudspeakers 24 and 26. These modifications may also be effected by means of appropriate switching of the signal paths within the processor 1. It is contemplated that the number of output terminals and loudspeakers as well as the arrangement of the loudspeakers may be varied according to the particular embodiment.

While not shown, it is understood that suitable power amplifiers may be applied between the low level output terminals 12–22 and the loudspeakers 24–34, either as a portion of the processor 1 or as one or more separate units, as can be appreciated by those skilled in the art.

The input conditioning and matrix means 6 conditions the input signals L and R as will be discussed and provides a plurality of combinations of the resulting signals which are designated by the output signal references L', R', −L', and −R' to the variable matrixing means 8 and the CVG 10.

Although not shown, it is understood that the input conditioning and matrix means 6 includes at least a pair of inverters and other conditioning and matrixing means. The input conditioning may include processing by means of a panorama control to be described later as well as processing by automatic input balancing and other techniques known to those skilled in the art. For this reason, the output signals are shown with primes (') to indicate that the signals L' and R may differ from the signals L and R.

The CVG 10 receiving the L' and R' signals conditioned by the matrix means 6 generates control voltage signals labeled Vcf, Vcb, Vcl and Vcr in a manner to be described. These signals are applied to the variable matrixing means 8.

The bandwidth of the input signals L' and R' from which the control voltages Vcf, Vcb, Vcl and Vcr are derived are limited within the servo logic control voltage generator 10 by means of band pass filters, as will be described. Further, signals responsive to the ratios of front-to-back information and left-to-right information are derived within the CVG 10, and are then smoothed and conditioned by a special servo logic variable time constant circuit, all as will be described below.

The variable matrixing means 8 includes fixed and variable gain elements to be described in greater detail for processing the L', R', −L' and −R' signals from the input conditioning and matrix means 6. The variable gain elements included in the variable matrixing means 8 are controlled by the externally applied control voltages Vcf, Vcb, Vcl and Vcr for generating the directionally enhanced output signals LF, RF, CF, LB, RB and CB for the respective loudspeakers 24–34.

Additional outputs (not shown) for the left side and right side loudspeakers 24, 30 and 26, 32, for example, may also be developed in the variable matrixing means 8. One or more subwoofer outputs (not shown) may also be developed by incorporating an electronic crossover into the means 8 or following it. As will be subsequently described, an improved bass equalizer may also be provided, typically for the left front and right front channels. Other modifications as will be apparent to those skilled in the art may also be made.

Figure 2:
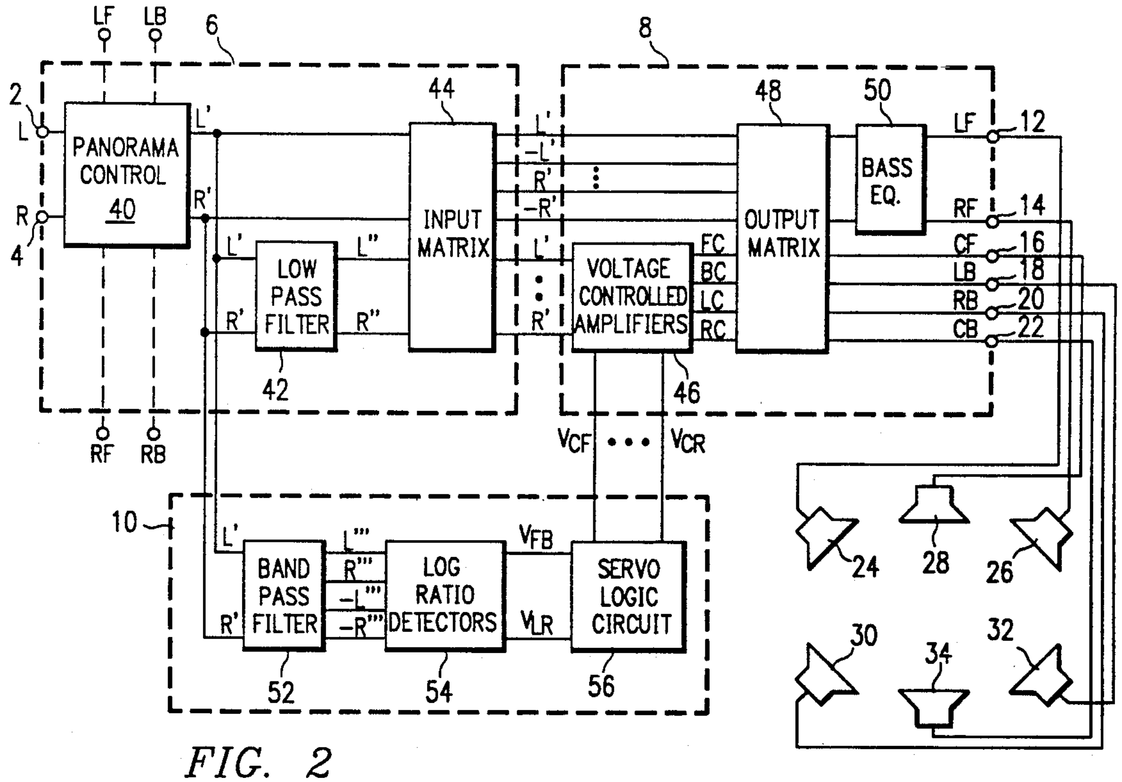
FIG. 2 is a functional block diagram illustrating in greater detail a configuration of the surround processor of FIG. 1.

Referring now also to FIG. 2, the input conditioning and matrix means 6 includes a panorama control 40, a low pass filter block 42 and an input matrix 44. The panorama control 40 functions to modify the input signals L and R by application of in-phase or antiphase cross-blending to produce the output signals L' and R' having a wider or narrower stereophonic spread than the input signals L and R. The panorama control 40 is optional and is discussed subsequently in detail with reference to FIG. 13. An alternative form of the panorama control, as disclosed with reference to FIG. 13, employs the alternate input terminals labeled LB, LB, RF and RB, shown in dashed lines in FIG. 2.

The output signals L and R from the panorama control 40 are applied to identical low pass filters in the low pass filter block 42 to provide output signals L" and R", which include only the low frequency components of the signals L' and R'. The low pass filters within the block 42 are accurately matched in frequency and phase response. Within the input matrix block 44, or subsequently, the signals L" and R' are subtracted from the L' and R' signals to provide signals containing only the mid- and upper frequency components of the signals L' and R', for processing by the variable gain elements of the variable matrixing means 8, so that split band processing may be carried out as will be described. The input matrix 44 also contains at least a set of inverting amplifiers (not shown) for providing the −L', −R', −L" and −R" signals and means for combining the signals as required for application to variable gain amplifiers within a voltage controlled amplifier (VCA) block 46 as will be discussed. Since the details of the input matrix 44 are conventional, it will not be described further.

The variable matrixing means 8 contains the voltage-controlled amplifier (VCA) block 46, an output matrix 48 and a bass equalizer circuit 50. The VCA block 46 includes a plurality of voltage-controlled amplifiers each of which is provided with one of the control voltages Vcf, Vcb, Vcl or Vcr, respectively. The purpose of the voltage-controlled amplifiers of the VCA block 46 is to provide variable gain paths for their respective input signals, controlled by the aforementioned control voltages, for application of these signals to the output matrix 48, thereby causing variation of the matrixing coefficients in accordance with signal directional information sensed by the CVG 10. As shown in FIG. 2, the four control voltages Vcf, Vcb, Vcl and Vcr provide dual-axis control, the front-back axis being provided by Vcf and Vcb, and the left-right axis being provided by Vcl and Vcr. It will be appreciated that in some embodiments of the invention, where single axis control is required for economy, the control voltages Vcl and Vcr may not be generated and corresponding VCAs will not be provided in the VCA block 46. Equally, it may be appreciated that additional control axes and, hence, control voltages may be provided and corresponding additional VCAs may be included in the VCA block 46.

The voltage-controlled amplifiers of the block 46 will be described in more detail later, with reference to FIGS. 11 and 12. Each of these VCAs typically has summing input circuits for both main and cancellation paths. The input matrix 44 may include the summing resistors for these inputs, generating L', R', L'+R', L'−R' signals and combining these subtractively with the corresponding low frequency signals L", R", L"+R", and L"−R" to produce combined signals containing only mid and upper frequencies, one for each VCA of the block 46. The output signals from the VCAs of the VCA block 46 are designated with the references FC, BC, LC and RC, being the signals used for signal-dependent cancellation of front, back, left and right components, respectively, when applied to the output matrix box 48.

The output matrix 48 receives the signals L', R' and their inverses −L' and −R' from the input matrix 44, and may also receive the signals L" and R" and their inverses, which are combined with the output signals FC, BC, LC and RC, respectively, from the VCA block 46. Accordingly, differing proportions of the direct signals from the input matrix 44 and the cancellation signals from the VCAs of the VCA block 46 are combined in a conventional manner by the output matrix 48 to produce appropriate loudspeaker feed signals, which in the preferred embodiment are the LF, RF, CF, LB, RB and CB signals for the six outputs 12–22, for application by suitable power amplifiers (not shown) to the six loudspeakers 24–34.

Thus, for example, cancellation techniques may be employed such that when a center front (CF) signal would be predominant, the voltage-control signal Vcf will cause signals to be applied to the LF and RF channel loudspeakers 24, 26 to cancel out the signals normally applied thereto by the direct signal paths. Cancellation in the rear loudspeakers may be similarly applied. Also, it will be apparent that a proportion of antiphase blend may be applied in the left and right front loudspeakers 24, 26, which is appropriately cancelled out at the opposite loudspeaker when pure left or right signals are present. As previously mentioned, the number of VCAs in the VCA block 46 may be changed to provide different specific directional characteristics of the input signals for single, dual or multiple axis sensing. According to a feature of the present invention as will be subsequently described, the cancellation techniques will typically be applied only at higher frequencies with the bass frequencies being passed without cancellation.

The bass equalizer circuit 50 shown in FIG. 2 is typically applied only to the left front and right front channels of the processor 1, but could be applied to any desired channels. The purpose of the circuit is to extend the effective frequency range of these two loudspeakers 34, 36 to more effectively reproduce low bass therein, and is especially useful when there is no subwoofer in the system. As mentioned previously, additional subwoofer outputs may be provided for improved bass response. The bass equalizer circuit 56 is discussed subsequently in qreater detail.

The CVG 10 includes a band pass filter block 52, a log-ratio detector block 54 and a servo logic circuit 56. A plurality of band-pass filters are provided in the block 52. One or more log-ratio detectors are provided in the block 54 and one or more servo logic circuits in the block 56, for applying variable time constants to output signals from the log ratio detectors and generating the control signals Vcf, Vcb, Vcl and Vcr.

The conditioned signals L′ and R′ received from the panorama control 40 are filtered by a matched band pass filters within the band-pass filter block 52, described in greater detail below with reference to FIG. 10. These filtered signals designated by the references L‴, R‴ and their inverses −L‴ and −R‴ are applied to the log ratio detectors in the log ratio detector block 54. Typically, only R‴ is inverted following the filter, but L‴ may also be inverted and in general also applied to the log-ratio detectors as required by a specific embodiment.

The log-ratio detectors within the block 54 determine "or sense" the ratio of front to back and left to right information contained in the stereo input to the processor 1. To accomplish front-back sensing, for example, a log-ratio detector pair within the block 54 receives the inputs L‴+R‴ and L‴−R‴ (or R‴−L‴) which are derived by means of summing resistors or otherwise and generates signals proportional to the logarithms of the absolute values of these signals. These signals are smoothed with a short time constant on the order of three milliseconds to eliminate "ripple" from the log ratio detector circuitry and are differenced to generate a signal corresponding to the logarithm of the ratio of front to back information in the input signals. Strictly, the signals are first differenced, the difference signal then being smoothed, as shown in FIG. 5, where the 3 ms time constant is provided by capacitor C105 and resistor R116. But capacitors C103 and C104 also provide some smoothing, and are for the purpose of removing ripple. A second log-ratio detector pair within the block 54 receives inputs L‴ and R‴ and generates a signal corresponding to the logarithm of the ratio between left and right information from the stereo input signals received by the processor.

It should be noted that because of the band-pass filtering of the L′ and R′ signals by the band pass filter block 52, the ratios generated by the log-ratio detectors of the block 54 are of the signals as weighted by the filtering and therefore represent these log ratios only for the specific bandwidth in which variable matrix processing will occur. For a typical audio application, this bandwidth is between 200 Hz and 10 kHz, approximately, as shown in FIG. 4.

The detector outputs from the block 54 are designated by the references Vfb and Vlr and are applied to the servo logic circuit 56, as described in detail later. The purpose of the servo logic circuit 56 is to "smooth" the output voltages Vfb and Vlr obtained from the log-ratio detector block 54 and to split these respective voltages each into a pair of control voltages moving in opposite senses for driving the voltage controlled amplifiers (VCAs) of the block 46. For example, the output voltage Vfb is split into the pair of control voltages Vcf and Vcb which move in opposite senses for driving the front and back voltage-controlled amplifiers, respectively. Similarly, the output Vlr is applied to a second servo logic circuit of the block 56 for generating the control voltages Vcl and Vcr which move in opposite sense for driving the left and right VCAs of the block 46, respectively. It is understood that in an alternative embodiment, the output voltage Vlr may be eliminated from the circuitry control voltage generator 16, thus resulting in single axis sensing of the front and back directions only.

Thus, as previously mentioned, the control voltages Vcf, Vcb, Vcl and Vcr operate to vary the gains of the VCAs in the VCA block 46, thereby varying the separation of the audio signals received by the processor 1 dynamically so as to increase the directionally of the sound reproduced by the loudspeakers 24–32.

According to another aspect of the present invention, the control voltages Vcf–Vcr for the VCAs in the VCA block 46 are provided by a detector system which must be preceded by a filter to eliminate low frequencies, since these are not to undergo cancellation. In addition, this filter should reduce extremely high frequencies since the ear does not use them for direction estimation.

FIG. 3 illustrates the circuitry for one of typically two filters contained within the band pass filter block 52 which implements a band-pass characteristic complementary to the Fletcher-Munson curve which relates to the sensitivity of human hearing across the frequency spectrum. The circuit comprises a two-pole low-pass network with capacitor C21, resistor R21, capacitor C22 and resistor R22, and a two-pole high pass network, consisting of capacitor C23, resistor R23, capacitor C24 and resistor R24 in cascade, around an op-amp OA6. The op amp OA6 is configured as a voltage follower, and is followed by an additional high pass pole comprising resistor R25 and capacitor C25, which are connected to a virtual ground input of the following log-ratio detector block 54.

FIG. 4 illustrates the approximate frequency response characteristic of a filter within the block 52 described above, empirically optimized to yield the values shown in FIG. 3. The last pole comprising the resistor R25 and capacitor C25 has not been included in this curve but yields additional low-frequency attenuation.

Referring now to FIG. 5, there is shown a log-ratio detector circuit contained within the log-ratio detector block 54, it being understood that two of such circuits are to be provided, one for generating the signal Vfb and the other for generating the signal Vlr. As shown, amplifiers U1A and U1D which may be of industry type. TL084, for example, employ matched diodes U2 in antiparallel arrangement as their feedback impedances, to perform a logarithmic amplifier function. The diodes U2 in both the amplifiers U1A and U1D should preferably be closely matched and are typically on the same diode array, which may be an industry type CA3141E, for example. The amplifier U1A has inputs L‴ and R‴ taken from the outputs of the band-pass filter block 52 (FIG. 2). The amplifier U1D has inputs L‴ and −R‴ from the band pass filter block 52, and is otherwise identical to the amplifier U1A. Resistors R101 and R102, and a capacitor C101, form the last time constant of the band-pass filter, functionally equivalent to the resistor R25 and the capacitor C25 discussed previously with reference to FIG. 3 and similarly for the network comprising resistors R103 and R104 and a capacitor C102.

Amplifiers U1B and U1C, with surrounding resistors R105, R106, R107 and R108, form fast inverters. The outputs of the amplifiers U1A and U1B pass through a pair of matched diodes U3 to a capacitor C103, which effectively peak-rectify the logarithmic amplifier output with a positive output voltage. A resistor R109 serves to bias these matched diodes and forms a discharge path for the capacitor C103. Similarly, the outputs of the amplifiers U1D and U1C are applied to matched diodes U3 and then to a capacitor C104, on which a negative voltage is developed, and a resistor R110 provides a bias for these diodes to the positive supply- rail and a discharge path for the capacitor C104. The main discharge path for the capacitor C103 is via a resistor R111 and that for the capacitor C104 is via a resistor R112, yielding time constants of about three milliseconds. It is understood that all four of the diodes U2 and U3 form part of a diode array of industry type CA3141E for accurate matching.

The two output voltages appearing on the capacitors C103 and C104, respectively are proportional to the logarithms of the amplitudes of the L'''+R''' and the L'''−R''' signals, corresponding to center front and center back components of the stereo inputs to the processor 1. The output voltage in such a circuit typically increases by about 60 mV for a tenfold increase in current through the diodes, corresponding to a tenfold or 20 dB increase in the output current through the capacitor C101 or C102. Where the input is fully left or fully right, both output voltages should have the same magnitude, but the polarities are opposite, so that the currents through the resistors R111 and R112 cancel out at the input of summing amplifier U4.

These currents are summed in the amplifier U4, which is preferably part of a industry type MC3403 quad op-amp, which has low crossover distortion. A resistor R116 provides negative feedback around the amplifier U4, setting the voltage gain at 75 with the values shown. Resistors R113 and R114 provide an offset trimming current to balance the detector by setting its output voltage to zero when a pure left or pure right channel signal is applied. The amplifier U4 is typically supplied from +7.5 V and −6.8 V rails, the latter being dropped from the −7.5 V supply by means of a diode D101 and decoupled by a capacitor C106. A limiting function is performed by the amplifier U4, allowing a maximum swing in each direction of approximately 6 volts peak. This output swing is achieved for an input voltage difference of about 80 mV, which corresponds to an approximate 21:1 ratio in the input currents applied to the log amplifiers, or approximately 13.3 dB. A feedback capacitor C105 provides an approximate 3.3 millisecond smoothing time constant around this stage. Other op amps in this quad are used in the servo logic circuit block 56, described subsequently in detail.

A resistor R115 is an additional feedback resistor which may be electronically switched in parallel with the resistor R116, reducing the detector gain by approximately 36% or 3.8 dB for use in some modes of processor operation selected by the function switching controls of the processor 1 (not shown), which apply a control voltage to the input labeled DET.GAIN. Thus, the output voltage Vfb generated by this circuit is applied to the servo logic circuit of the block 56, and in the circuit shown, goes negative for front signals and positive for back signals.

It is understood that a similar circuit (not shown) to that described with reference to FIG. 5 may be employed for the left and right sensing to generate the signal Vlr. In this circuit, the resistors R101 and R102 would be replaced by a single 10K resistor, to which the signal L''' is applied, and the resistors R103 and R104 would similarly be replaced by a 10K resistor to which the signal R''' is applied. The circuit operates as just described, thereby generating the output voltage Vlr, which swings negative for left signals and positive for right signals. In this circuit, the offset is adjusted with a center front signal, with equal amplitude signals applied to both the L and R inputs of the processor 1.

The foregoing particular configuration of a full wave rectifier in the log-ratio detector circuit, as described, thus has superior, repeatable performance, relative to the typical circuit used in log-ratio detectors according to the prior art. This is because the gains of the inverting amplifiers formed by amplifiers U1B and U1C with the associated resistors R105–R108 are accurately defined and these amplifiers have wide bandwidth and low offset voltages, and the diodes in array U3 are accurately matched.

In accordance with a feature of the present invention, the details of a servo logic circuit of the block 56 will now be described with reference to FIGS. 6 and 7. The purpose of this circuit is to vary the rate at which the control voltages Vcf, Vcb, Vcl and Vcr respond to changes in predominant signal source direction, while maintaining very smooth operation so that the changes in processor operation are not noticeable to the listener.

Figure 6:
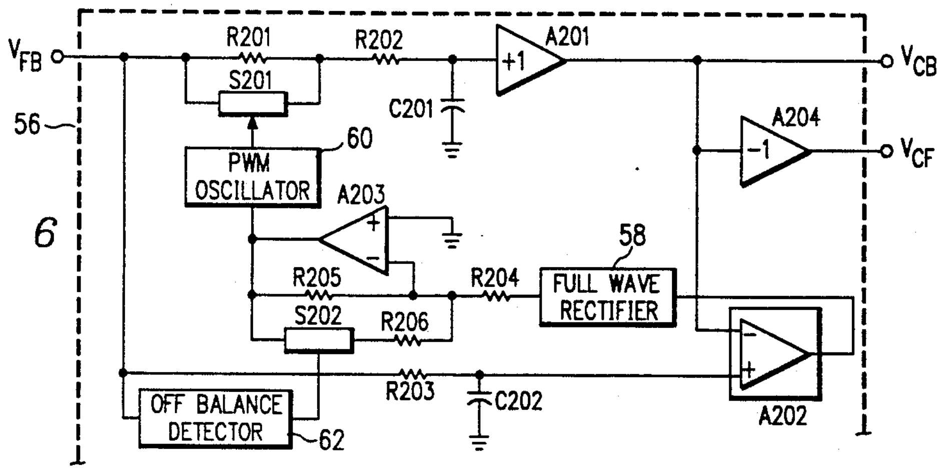
FIG. 6 is a schematic block diagram of a servo logic circuit according to the invention, for applying variable time constants to the control voltages derived from the log-ratio detectors in the processor of FIG. 2.

FIG. 6 shows a simplified schematic of a servo logic circuit of the block 56 for generating the control voltage signals Vcb and Vcf, it being understood that a similar circuit may be contained within the block 56 for generating the control voltages Vcl and Vcr. Accordingly, a log-ratio detector output such as Vfb is applied to the input where it is passed into two R-C time constants. An upper time constant is formed by resistors R201 and R202 in series, and a capacitor C201. A lower time constant is formed by a resistor R203 and a capacitor C202. An amplifier A201 is a unity gain buffer, the output of which follows the voltage on the capacitor C201. An amplifier A202 is a differential amplifier and receives both the buffered voltage from the capacitor C201 and that on the capacitor C202 and compares these voltages, producing an error voltage at its output. This error voltage is rectified by a full-wave rectifier 58 which therefore produces an output proportional to the absolute value of the error. This error signal is applied via a resistor R204 to the inverting input of an amplifier A203, which applies and inverts it with gain determined by resistors R205 and R206 in parallel, if a CMOS switch S202 is on, and otherwise by a resistor R205 alone. It is understood that the switch S202 is normally on. The resulting output voltage from the amplifier A203 is applied to a PWM oscillator 60, which produces a train of pulses at its output with a duty cycle proportional to the error signal. These pulses are applied to a CMOS switch S201, which short circuits the resistor R201, thereby shortening the upper time constant. This time constant can be varied between 3.5 milliseconds and 50 milliseconds with the component values shown subsequently in FIG. 7.

When the switch S201 is open, the upper time constant is substantially longer than the lower time constant. When the switch S201 is closed, it is made much shorter, typically shorter than the lower time constant. The error voltage produced will be proportional to the rate of change of the input signal Vfb and to the difference between the upper and lower time constants. For a given rate of change, the PWM oscillator generates a train of pulses of constant width, shorting out the resistor R201 for such a proportion of time that the upper time constant nearly matches the lower one. The faster the rate of change, the closer the matching will become. Since the upper time constant is always longer than the lower one, the response speed of the circuit increases in proportion to the rate of change of the detector output voltage applied to its input. At intermediate levels of control, the switch S201 is on for a proportion of time, having the effect of reducing the apparent resistance in series with the capacitor C201 and thereby reducing the upper time constant to some value between the longest and the shortest available.

Still with reference to FIG. 6, an off-balance detector 62 is provided in the servo logic circuit. Whenever the absolute value of the input signal Vfb exceeds a certain threshold, the off balance detector 62 switches off a CMOS switch S202, having the effect of increasing the loop gain of the servo logic circuit by raising the gain of the amplifier A203. This enables the circuitry to reach the maximum speed as defined by the resistor R202 and the capacitor C201, while when the switch S202 is off, slower and smoother performance results. It should be noted that when the circuit 62 operates, there is usually a difference signal present, and the sudden change in gain will force the output of the amplifier A203 to its maximum value for a short period and hence attain the maximum logic speed because the PWM oscillator 60 will be driven to its maximum duty cycle. The switch S202 may be held off by means of a switch S206 (described with reference to FIG. 7) to which an input labeled LOGIC SPEED is applied. This mode is typically used for classical music reproduction.

Thus, the effect of the servo logic circuit just described is twofold. When the control voltage signal Vfb varies relatively slowly, the time constant applied to it remains long, and the output voltage across the capacitor C201 is varied very smoothly. This voltage becomes the Vcb control voltage after buffering by the amplifier A201. The inverter A204 inverts this signal and its output is the voltage control signal Vcf. When the signal variation is faster, the servo logic error voltage increases and the upper time constant is forced to match that of the lower R-C network. If the error voltage is large enough, the closeness of this matching is further enhanced by raising the gain of the amplifier A203. If the control voltage swings fast enough, the PWM oscillator 60 will cease to generate a pulse train and hold the switch S201 on, thereby making the upper time constant that of the resistor R202 and the capacitor C201. It has been found that if this time constant is shorter than the lower time constant, the lower time constant will then dominate the performance of the circuit. Consequently, it is possible to omit the capacitor C202 altogether, and make the resistor R202 and the capacitor C201 determine the minimum time constant instead.

In operation, the servo logic circuit of block 56 (FIG. 2) thus provides means for smoothing the directional information signals Vfb and Vlr received from the detector block 54 with continuously variable time constants to generate the control voltage signals Vcf–Vcr. The circuits are responsive to both the rate of change and amplitude of the detector signals Vfb and Vlr, such that as the difference between the control voltage signals and the detector signals increases, the value of the time constants decreases to permit the control voltage signals to follow closely the detector signals. Likewise, as the difference between the control voltage signals (Vcf–Vlr) and the detector signals (Vfb and Vlr) decreases, the value of the time constants increases so that variations in the control voltage signals are smooth.

Figure 7:
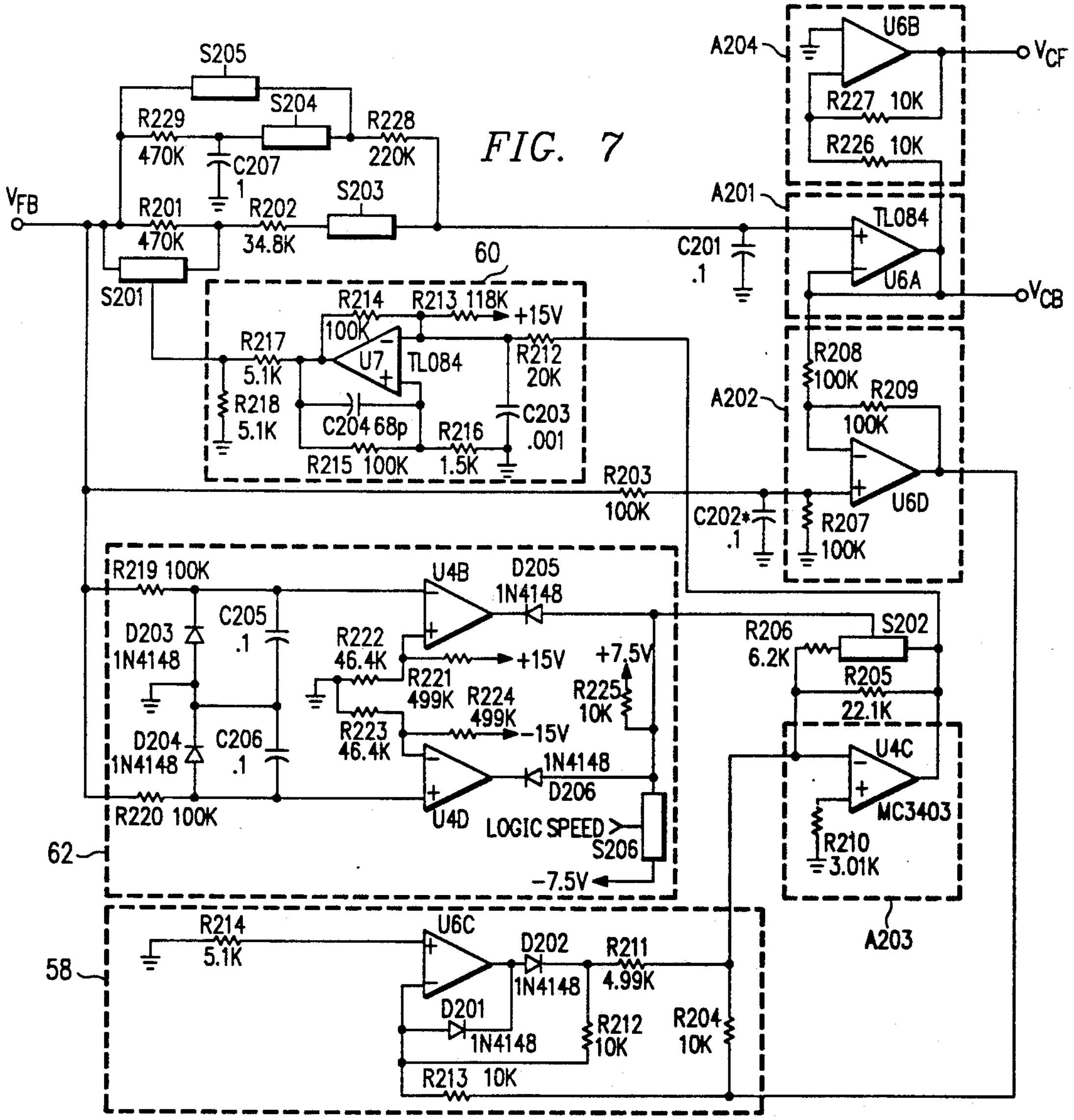
FIG. 7 is a detailed schematic diagram of a preferred embodiment of a servo logic circuit according to FIG. 6.

Referring now to FIG. 7, there is shown a detailed schematic of the servo logic circuit 56 in a preferred embodiment of the processor 1. In this circuit the voltage Vfb is applied to the resistors R201 and R202 in series, via the switch S203 to the capacitor C201. With the values shown, the longest time constant is about 50 milliseconds and the shortest about 3.5 milliseconds. The amplifier A201 is one amplifier U6A of a TL084 quad op amp, connected as a source follower, which buffers the voltage developed across the capacitor C201. The voltage Vfb is also applied to the resistor R203, and then to the capacitor C202, it being understood that the capacitor C202 may be omitted according to the particular embodiment.

Resistors R203, R207, R208, R209 and amplifier U6D form the differential amplifier A202. The effective time constant here is five milliseconds, as the resistors R203 and R207 are effectively in parallel to the capacitor C202. With the capacitor C202 removed, the time constant is then zero, and the maximum speed is determined by the 3.5 millisecond time constant of the resistor R202 and the capacitor C201. Overall, the effective time constant is about five milliseconds, because of the three millisecond time constant of the preceding detector amplifier shown in FIG. 5. Amplifier U6C with its associated components forms the full wave rectifier and is in a standard configuration. For a positive input, the resistor R204 transmits a current to amplifier U4C while diode D201 conducts and diode D202 is shut off. However, for a negative input, the amplifier U6C has a unity gain (with a diode drop inside the feedback loop) and drives an opposing current via the resistor R211 which is twice that through the resistor R204, so that on each input polarity the circuit produces a positive input current to the amplifier U4C. The output of the amplifier U4C thus goes negative proportionally to the difference between the voltages applied to the amplifier U6D via the resistors R203 and R208, and independently of the sense of the difference. A resistor R210 provides offset current compensation for the amplifier U4C, which is typically part of an MC3403 quad op-amp shared with the circuit of FIG. 5. This op-amp U4C is supplied from reduced voltage rails and therefore its output swing is reduced to about +/−6 V.

The amplifier U4C with its associated resistor R210 equates to the amplifier A203 of FIG. 6, and the resistor R205 with resistor R206 in parallel yields a voltage gain of −0.48 when the switch S202 is on, and this rises to −2.21 when the switch S202 turns off. This is accomplished by the threshold detector 62 as indicated previously. The amplifier U4C is a low crossover distortion amplifier such as an industry standard MC3403, and may be in the same package as the amplifier U4 of FIG. 5 in practice, as its output swing is required to be limited because it drives the CMOS switch S202.

The pulse width modulated (PWM) oscillator 60 is formed from an amplifier U7, which is a TL084 op amp, and the associated resistors R212 through R218 and capacitors C203 and C204. When the input voltage applied via the resistor R212 is zero, the amplifier output is held negative by the resistor R213, and the output voltage is divided down by the resistors R217 and R218 to be applied to the CMOS switch S201, which is a part of an industry standard type CD4066.

When the input voltage goes more negative than the threshold set by the resistors R215 and R216, this circuit begins to oscillate at a rate determined by the capacitor C203 and the effective driving resistance of the resistors R212, R213 and R214 in parallel. The duty cycle increases until at a high enough negative input voltage on the capacitor C203 the amplifier output remains positive continuously, keeping the switched S201 turned on. The frequency of oscillation is typically well above the audio range, although this is not necessary since the switching signal does not enter the audio signal path.

The threshold detector circuit 62 comprises two more of the op amps in the same MC3403 package, U4B and U4D. This package is supplied from reduced voltage rails, so that its output voltage limits are appropriate for driving CMOS switches between +7.5 volts and −7.5 volts supply rails. Resistors R219 and R220 apply the raw control voltage Vfb to capacitors C205 and C206 which are clamped by diodes D203 and D204, respectively. When the voltage at the input of the amplifier U4B is higher than the positive voltage set by resistors R221 and R222, approximately 1.28 volts, the output goes negative, pulling down the input to the switch S202 via diode D205 and thereby increasing the gain of the amplifier U4C. This voltage is normally held at +7.5 volts by a resistor R225. Similarly, when the voltage on the capacitor C206 goes more negative than the negative voltage set by the resistors R223 and R224, −1.28 volts, the output of the amplifier U4D goes negative, pulling down the S202 switch input via diode D206.

The two clamp diodes D203 and D204 serve an important purpose, in that without them, the capacitors C205 or C206 might be charged to a high voltage in the opposite direction to which they are required to be charged to turn on the appropriate comparator, so that if the control voltage applied changes rapidly from a fully positive state to a fully negative state, a considerable time elapses in which the gain is reduced, because both comparators turn off as the voltage swings through the 2.5 volt window around zero volts. With the clamp diodes, the second comparator only has to charge from +0.7 volts to −1.28 volts, reducing its turn-on time by a factor of five. The result is that both comparators ma stay on and the logic circuit acts faster.

For low input levels and signals where no direction predominates, or when fully left or right signals are present, the control voltage remains near zero and the loop gain of the servo loop remains low, causing the time constants to remain fairly slow and leading to very smooth decoder action. Yet when large control voltage swings occur, the PWM circuit 60 insures that they are followed with a fastest overall time constant (including the detector time constant) of about five milliseconds, which has been found to give optimum results in conditions of rapidly varying source direction vector.

As previously mentioned, the amplifier A204, comprising the amplifier U6B and resistors R226 and R227, inverts the output of the amplifier A201 which is the Vcb control voltage, and thereby generates the control voltage Vcf, which is the other control voltage of this pair.

Switch S203 is used to turn off the servo logic system by breaking the path through the resistors R201 and R202. Switches S204 and S205 are turned on in different user-selected configurations by control means (not shown), and resistors R228 and R229, with capacitors C207, set up some very slow time constants. With the switch S205 on and the switch S204 off, the resistor R208 sets up a twenty two millisecond time constant with the capacitor C201. With the switch 204 on and the switch 205 off, the resistor R227 and the capacitor C207 set up a 470 millisecond time constant. In these modes, the servo logic is inactive and the processor yields lower dynamic separation but very smooth performance. In practice, these two logic speeds are used by the Dolby Pro-Logic mode, and the threshold detector 62 is still active, determining when the fast or slow time constants are to be used. If Dolby Pro-Logic is not enabled, both switches stay off. If the logic speed input to the switch S206 is high, the amplifier A203 is switched to high speed and the servo logic stays in the high loop gain mode continuously. However, if Pro-Logic is enabled, the switch S206 is held low and therefore the threshold detector cannot be disabled.

It is understood that a second servo logic circuit identical to this one is used for the left-right detector output voltage Vlr, which is separated into control voltages Vcl at the upper right and Vcr at the lower right output terminal of FIG. 7.

The threshold detector 62 is also referred to as the off-balance detector in FIG. 6 and as an absolute magnitude comparator, since it compares the signal with a positive voltage in one case and a negative voltage in the other, one or the other comparators pulling down the control terminal of S202 via diodes D205 or D206 if the absolute magnitude of the Vfb control voltage exceeds the threshold voltage.

It is understood that in an alternative embodiment, a one-shot can be added between the output of the threshold detector 62 and the switch 202, in accordance with Fosgate, U.S. Pat. No. 4,932,059, causing the speed up in performance to occur for a limited, defined short period after a short strong center front or back event is detected. As noted in Fosgate '059, the advantage of such a circuit is to force the control voltages to assume their correct values as soon as possible after sensing a signal attack, while restoring the slower time constants within a period of time short enough to avoid any audible distortion. However, this variation may not be normally be necessary, as the effect of the circuit, of FIG. 7 is already to drive the logic speed to its maximum but only until the voltage on the upper capacitor C201 reaches that on the capacitor C202, which will occur substantially within the time that would be set by such a one-shot.

Figure 8A:
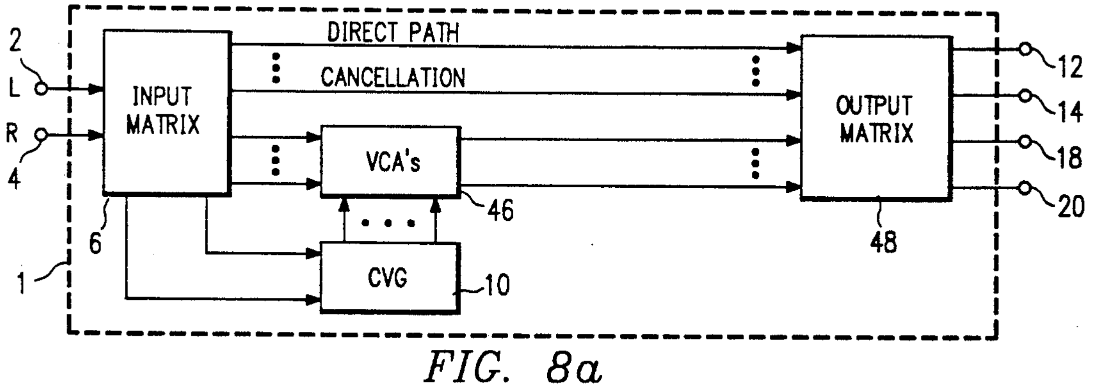
FIG. 8A is a functional block diagram of a full range surround processor.
Figure 8B:
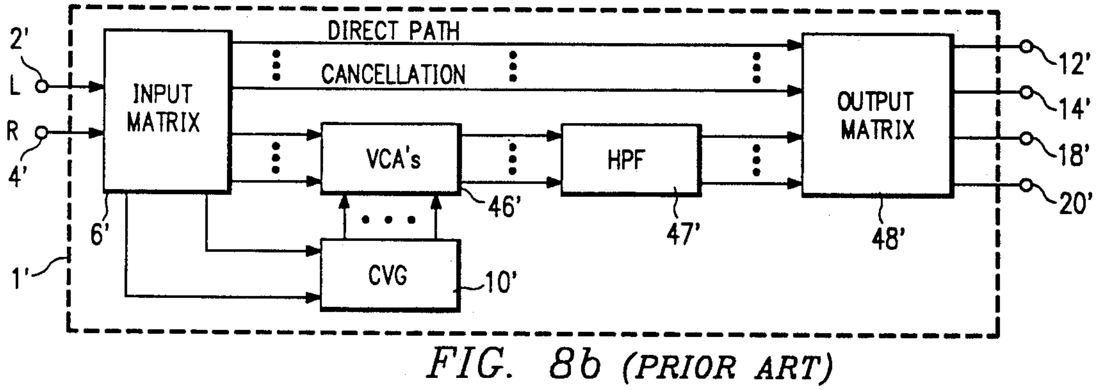
FIG. 8b (PRIOR ART)
FIG. 8B is a functional block diagram of a split band surround processor wherein a high pass filter is used to restrict the band of frequencies passed by the variable gain elements so as to cause the processor to apply variable matrixing only to the higher frequencies and fixed matrixing to the low frequencies.
Figure 8C:
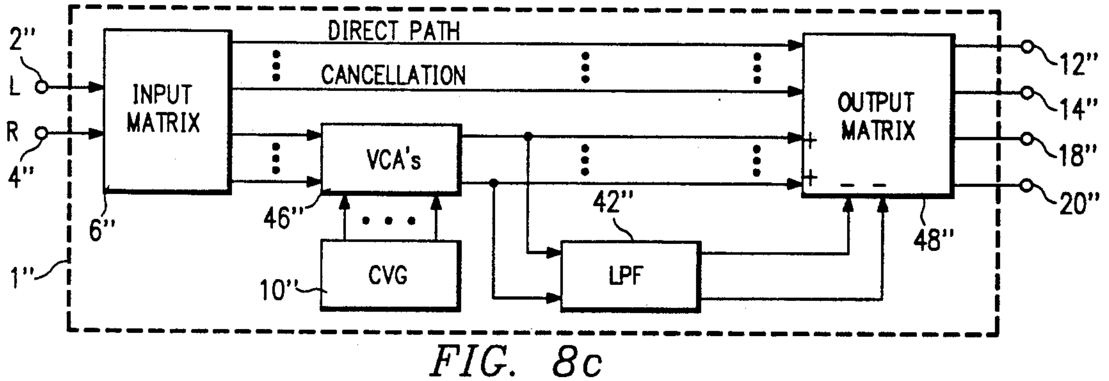
FIG. 8C is a functional block diagram of a split band processor in which a high pass function included in the signal path through the variable gain elements is generated by using a low pass filter and subtracting its output from the full range signals, so as to apply variable matrixing to the upper frequencies and fixed matrixing only to a well defined low frequency band as passed via the low pass filter.

In accordance with another aspect of the present invention, improvements in split-band processing will now be described with reference to FIGS. 2, 8A, 8B, 8C and 9. In FIG. 8B, components similar to those previously described will be given the same reference numerals with a prime (') designation, indicating that such represents prior art band splitting arrangements as they would be incorporated into a surround processor 1 of the general form of the present invention as shown in FIG. 8A. In FIG. 8C, the components similar to those previously described will have the same reference numerals with a double prime (") designation, indicating that such represents an alternative embodiment to the processor of the present invention shown in FIG. 2.

In practice, it has been found preferential to provide directional enhancement of audio signals only in the midrange and upper-frequency register, while providing fixed matrixing at the bass frequencies. The foregoing is achieved by means of the bass subtraction arrangements which will be described below with reference to FIGS. 2, 8C and 9.

FIG. 8B is a simplified block diagram of a prior art split band processor 1' providing processing only at higher frequencies. A conventional input matrix 6' processes the L and R inputs applied to terminals 2' and 4', respectively, to provide direct signals via lines designated DIRECT PATH to an output matrix 48'. It is understood that the input matrix 6' does not include the low-pass filter of the input conditioning and matrix means 6 of the present invention, as shown in FIG. 2. Cancellation signals are provided from the input matrix 6' to voltage controlled amplifiers (VCAs) of block 46'. The cancellation signals are varied by signal-dependent control voltages derived from a control voltage generator (CVG) 10'. High-pass filters (HPF) within block 47' are placed in series with the VCAs and the block 46' in the cancellation path. The output matrix 48' receives the signals from the direct and the cancellation paths and provides output signals to output terminals 12'-20', for application to several amplifiers (not shown) and loudspeakers (as shown in FIGS. 1 and 2). The result of placing the high-pass filter block 47' in series with the VCA block 46. cancellation path is that the high frequency band signals are subtracted out of the full range version of those signals, effectively yielding a low-pass filtered signal. However, it can be shown that no matter what attenuation slope is chosen for the high pass filter 47', the corresponding low-pass filter result obtained by subtraction can have no more than a six (6) decibel per octave slope, which means that significant amounts of undesired frequencies can still reach the output terminals of the processor. The foregoing is illustrated by the dashed line attenuation curve labeled "B" in FIG. 10. Referring now to FIG. 8C, there is illustrated in block diagram form the a split band 1" according to the present invention. The processor 1" includes a low-pass filter block 42" in a side chain. The outputs from the low-pass filter block 42" are also fed to the output matrix 48". By subtracting the outputs from this filter block 42" from the unfiltered outputs of the VCA block 46", the low frequencies are cancelled out in operation of the processor. The advantage of using the low-pass filter block 42" over the high-pass filter arrangement of the prior art shown in FIG. 8B, is that the bass frequencies are rolled off more sharply when the signals recombine in the output matrix 48". In more detail, it should be noted that the intention is to process the low frequencies with a fixed matrix, but to pass the upper frequencies through a variable matrix. Cancellation is achieved by subtraction of a signal passed through one of the VCAs from the corresponding signal passed directly to the output matrix 48".

Referring again to FIG. 2, the low-pass filter and summing circuit 42 of the present invention can be placed ahead of the VCA block 46 and also ahead of the input matrix block 44, as shown in FIG. 2. It is also noted that the filters are typically of the inverting two pole or three-pole multiple feedback type, three pole filters being preferred.

Figure 9:
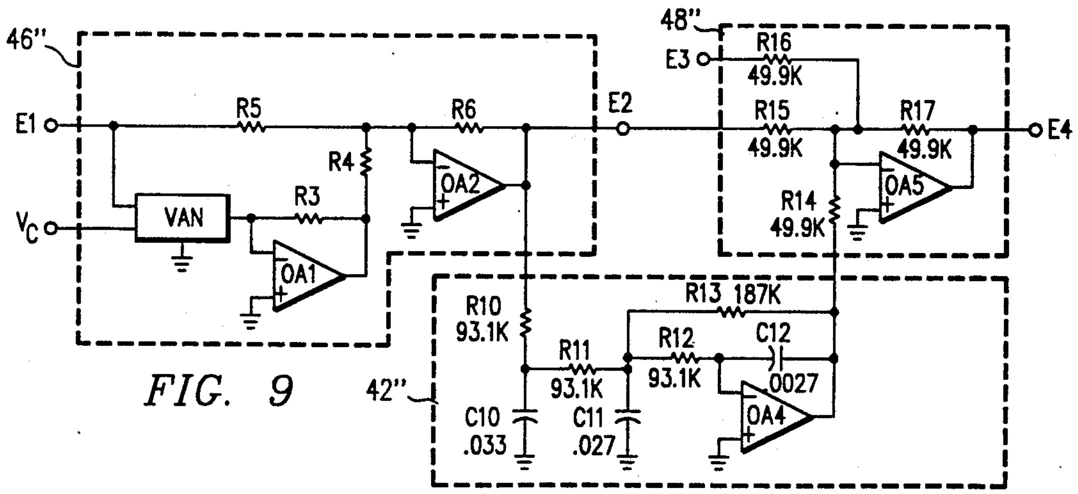
FIG. 9 is a detailed schematic diagram of an embodiment of a filter circuit according to FIG. 8C.

Reference is now made to FIG. 9, which illustrates a typical filter configuration for use in the circuit of FIG. 8C. As shown, a typical voltage controlled amplifier of block 46" comprises operational amplifiers OA1 and OA2, and associated components. The VCA in block 46" receives an audio signal at terminal E1 and passes it with variable gain to terminal E2. This signal is applied via a resistor R15 to a summing amplifier OA5, which forms part of the output matrix block 48". It is also applied to a resistor R10, with which capacitors C10, C11, C12, resistors R11, R12 and R13, and amplifiers OA4 form a three-pole inverting multiple feedback filter of a standard form known to those skilled in the art. A two-pole filter ma alternatively be used by omitting the resistor R10 and the capacitor C10 and changing the other component values accordingly. The output of the amplifier OA4 is also applied via a resistor R14 to the summing input of an amplifier OA5. At low frequencies, therefore, the two signals via the resistors R15 and R14 are equal and in opposite phase and thus cancel out. At upper frequencies, the output of the amplifier OA4 is negligible, and the signal applied to the amplifier OA5 via the resistor R15 is not cancelled out.

A third signal is applied via the direct path to an input terminal E3 and then via a resistor R16 to the summing amplifier OA5. Since the VCA shown inverts the signal applied to terminal E1, if the same signal appears at terminal E1 and terminal E3, the result will be that at maximum gain of the VCA, the signals through the resistors R16 and R14 will cancel out, and the output of the summing amplifier OA5, which appears at a terminal E4, will therefore be zero. At low frequencies, however, the cancellation signal via the resistor R15 is itself cancelled out by the signal through the resistor R14, so it can have no effect on the signal passed via the resistor R16, which is therefore only cancelled at mid and upper frequencies.

Thus, high pass filtering action has been generated in the cancellation path by subtracting the low-pass filtered signal from the full range signal. When this in turn is subtracted from the full range signal applied to the output matrix 48" via the direct path, what is left is the low-pass filtered signal only, and this has been passed through the two-pole or three pole filter previously described. The advantage of using the low-pass filter arrangement just described instead of the high-pass filter version of the prior art shown in FIG. 8B, is that the bass frequencies are rolled off more sharply when the signals recombine in the output matrix 48". Thus, the low frequencies are processed with a fixed matrix and the upper frequencies are passed through a variable matrix, and cancellation is achieved by subtraction of a signal passed through one of the VCAs from the corresponding signal passed directly to the output matrix 48", as shown in FIG. 9.

The curve A of FIG. 10 is typical of the attenuation achieved using a two-pole filter, while curve C shows the steeper slope associated with a three pole filter. The cut off frequencies of these filters may be adjusted for the best audible results, but both filters show attenuation of about 60 decibels at 2 kHz, contrasted with only 30 decibels for the arrangement of FIG. 8B shown by curve B in FIG. 10.

In an alternative embodiment (not shown) of the split-band principle exemplified here, the components of FIG. 9 may be rearranged so that the high pass filter comprising the summing amplifier OA4, the resistors R10 through R13 and the capacitors C10 through C12, is driven from the terminal E1 and its output is applied via the resistor R14 to the inverting input of the summing amplifier OA2. Additionally, it would be applied to the variable attenuator network with a second resistor. In this case, the resistor R14 would match the resistor R5, and if the VCA is substantially as shown in FIG. 12, these resistors would be 100K each; and the resistor driving the variable attenuator network would be 200K. The action of this arrangement is to cancel the input to the VCA at low frequencies, while at high frequencies, the VCA behaves normally and its output cancels the signal fed to the summing amplifier OA5 via the terminal E3 and the resistor R16, as previously described.

Reference is now made to FIG. 11, wherein a variable gain amplifier circuit according to the present invention is described, forming one of a plurality of such circuits contained within the voltage-controlled amplifier block 46 of FIG. 2. In this circuit, a signal voltage applied to an input terminal E1 causes a current to flow through a variable attenuator network (VAN), into the inverting input of an operational amplifier OA1, which is a virtual ground. The VAN also has a control input designated with the reference VC.

The value of a feedback resistor R3 determines the voltage which appears at the output of the operation of amplifier OA1. This voltage, which is, of course, inverted relative to that of the terminal E1, is applied via a resistor R4 to the inverting input of a summing amplifier, OA2, which is also a virtual ground. The voltage at the terminal E1 is applied via a resistor R5 to the same point. A feedback resistor R6 determines the gain of the amplifier OA2, and hence the output voltage of the amplifier, which appears at a terminal E2. The values of the resistors R3 and R4 are chosen such that the current through the resistor R4 is equal and opposite to that through the resistor R4 when the attenuation of the VAN is minimum. Hence, the output of the amplifier OA2 is nulled. When the attenuation of the VAN is infinite, the overall gain of the VCA is set by the resistors R5 and R6. At intermediate values of attenuation, the output current from the op-amp OA1 via the resistor R4 is subtracted from the direct input current via the resistor R5, and the VGA has an intermediate gain.

The variable attenuation network may be realized with a number of different circuits. For example, it may comprise a T network consisting of two series resistors and a field effect transistor (FET) acting as a voltage controlled variable resistor shunting their junction to ground, as will be described in FIG. 12. Furthermore the number of inputs may be expanded to perform signal combining at the VGA input as required for some of the functions detailed below.

Another method of realizing the attenuator of FIG. 11 may use a two-quadrant multiplier which permits the gain of the amplifier OA1 to vary from zero to some specific maximum value A, where its output through the resistor R4 will cancel the direct input via the resistor R5 to the amplifier OA2.

The advantage of this particular configuration is that when the gain is maximum, all the signal passes through the signal path, which consists of the resistors R5, R6 and the amplifier OA2 only, and this path can be designed to add very little noise. When the attenuation of the VAN 301 is minimum, the VAN typically produces very low noise, so that, once again, very little noise is added to the signal.

In FIG. 12, there is depicted a detailed schematic of a VCA according to the present invention. The left (L) the inverted right (−R) signals are each applied to the inverting input of the amplifier OA1 via the resistors R1A and R1B, respectively. These resistors may typically have a value of 200K. A resistor R2 is typically 1.5K, so that the input voltage is attenuated by about 43 decibels at the junction of the resistors R1A, R1B and R2, when and FET Q1, acting as a variable resistance element, is off. This permits the FET to operate at a low signal voltage for minimum distortion.

The resistor R3 has a value of 100K in this circuit, and the resistor R4 is 46.4K. If a signal of 1 V is applied to either terminal E1A or E1B, corresponding to a pure left or pure right signal at the processor inputs, the output of amplifier OA1 will be 496 mV when FET Q1 is fully cut off. In practice, the potentiometer R9 is adjusted to reduce the gain by about 0.5 dB, so the FET Q1 is just turned on. This means that the voltage would be set to about 464 mV at the output of amplifier OA1 under these conditions, so that the current through resistor R4 exactly cancels the current through resistor R5A or R5B.

When a signal of 1 V is applied to both E1A and E1B terminals, which corresponds with a center back decoder input, the control voltage generator 10 of FIG. 2 will apply the maximum back control voltage to the point labeled Vc, driving the FET Q1 fully on. Its minimum resistance is about 330 ohms, typically, so that the current into amplifier OA1 is considerably attenuated, but not completely so. At this value of resistance, the input currents will total 99.8 uA, and of this, about 18 uA will pass through the resistor R2 causing the voltage at the output of the amplifier OA1 to be 180 mV. This voltage is applied via the resistor R4 to the inverting input of the amplifier OA2, which is at virtual ground, providing a current of 3.88 uA in antiphase to the total of 20 uA provided through resistors R5A and R5B, so that the net current into the input of amplifier OA2 is 16.12 uA. The gain of the amplifier OA2 is adjusted so that its output voltage at terminal E2 is exactly 1 V under these conditions, by adjustment of variable resistor R6B, making the total resistance of resistors R6A and R6B about 62K.

The control path for the FET Q1 comprises operational amplifier OA3, which is a unity-gain buffer, resistors R7 and R8, diode D1 and potentiometer R9. The DC voltage at the drain of the FET Q1 is nominally zero, and the AC voltage here is a function of the attenuation produced by the FET Q1. This voltage is buffered by the amplifier OA3 and applied to the resistor R7, R8, diode D1 and potentiometer R9. The value of the resistor R7 should be equal to the sum of the resistor R8, the AC impedance of diode D1, and the effective impedance of the potentiometer R9. In a typical circuit, the resistor R9 could be 10K, and would be set at its midpoint, yielding an effective resistance of 2.5K.

With the bias at the wiper of the potentiometer R9 set at −7.5 V, the diode current is approximately 75uA, and the effective impedance of the diode is about 400 ohms. Thus if the resistor R7 is 49.9K, a suitable value for the resistor R8 is about 3K lower, for example 46.4K, although this value is fairly uncritical. The diode D1 is required to avoid forward biasing of the FET Q1 and to compensate for temperature variations. The purpose of this resistor chain is to cancel the even order distortion which would otherwise be introduced by the FET Q1, and to eliminate control voltage feed through into the audio path and is a standard technique known to those skilled in the art. The FET Q1 should have a pinch off voltage of about −3.5 V, for correct operation in this circuit.

The FET Q1 is typically AC coupled to the junction of resistors R1 and R2, by means of an electrolytic capacitor C1 in parallel with a disc ceramic capacitor C2, which serves to bypass the electrolytic at higher audio frequencies. This prevents offsets from being generated by the control circuitry and passed into the attenuator itself.

In order to provide an additional processing function within this decoder, a new preprocessor section shown in FIG. 13 has been incorporated into the system. This preprocessor provides a variable panorama control for use with records having varying degrees of left-right separation.

In typical applications for automobile use, a fader control is provided to vary the level between front and rear pairs of loudspeakers. Usually this fader control is an internal control of the radio or tape source unit. An alternative method of control of the surround sound environment is described here as a panorama control and shown in FIG. 13, which corresponds to block 40 of FIG. 2 as indicated by the broken outline.

The benefit of a fader control of this type is that in a moving vehicle, FM reception is often subject to "picket-fencing" effects due to rapid fading of the signal as the vehicle passes through regions where standing waves are present through reflections from buildings, mountains, etc. In a typical car radio, this effect is compensated for stereo reception usually by gradually blending the left and right channels down to mono as the signal fades below the desirable minimum level for stereo reception, and then gradually mutes the signal as the signal level falls below the acceptable threshold for monophonic reception. When such a stereophonic signal is applied to a surround processor, the stereophonic signal is wrapped around the listener, and the collapse to monophonic is far more noticeable as it involves a shift of balance towards the front. Use of the panorama control in such circumstances can alleviate this effect by reducing the initial separation, if necessary, all the way to monophonic, prior to the processor proper.

In other situations, where the stereo signal is strong or not subject to this type of fading, the intermediate range of the panorama control provides an effective front rear balance control by varying the degree to which the stereo signal is wrapped around the seating position. When the control is set fully clockwise, the signal again becomes monophonic, but is directed to the rear only. However, this would be of little value in a car, as the difference signal (L−R) is sent to the rear in this case.

When used with records having less separation, such as the "mono-compatible" stereo records of the early 1960's, the sound stage can be broadened by this control to undo the effect of reduced separation deliberately introduced in such records. Also, when a record has been produced with inappropriately broad separation, the control can be used to reduce it to an appropriate stage width.

Referring to FIG. 13, the panorama control 40 shown in FIG. 2 receives stereo input signals labeled L and R. Operational amplifiers A501 and A502 connected as source followers, respectively, buffer these left and right signal inputs. The outputs of these amplifiers are applied to the wipers of the dual ganged panorama control potentiometers R501A and R501B. The counterclockwise terminals of these potentiometer elements are connected to terminals identified as LF and RF, respectively, and the clockwise terminals to terminals LB and RB. In an . automobile version, A501 and A502 and the dual potentiometer would be omitted and these four terminals would be driven from the front and rear outputs of the car radio, employing the internal fader therein as the panorama control potentiometer.

Operational amplifiers A503 and A504 invert the signals appearing at RB and LB terminals respectively, applying their outputs via resistors R506 and R507 to summing amplifiers A505 and A506 respectively. The other inputs to A505 are: from terminal LF via resistor R508; from terminal LB via resistor R512; and from terminal RF via resistor R510. Similarly, A506 receives inputs from LF, RF and RB terminals via resistors R511, R509 and R513 respectively. All these resistors have equal values, as do the resistors R502, R504, R503 and R505 which determine the gain and input impedance of inverters A503 and A504.

Thus amplifier A505 receives the combined signal (LF+RF+LB−RB) and amplifier A506 receives the combined signal (LF+RF+RB−LB).

In the central position of the panorama control or the car radio fader control, equal signals appear at LF and LB, and equal signals are also present at RF and RB. The signals applied via resistors R508 and R512 are summed at the inverting input of amplifier A505, while the signal via the resistor R506 cancels that applied via the resistor R510. The right channel is thereby cancelled out of amplifier A505 while a unity gain for the left channel is assured by means of the resistor R515 (in the version including amplifiers A501 and A502, and potentiometers R501A and R501B, the value of resistors R515 and R516 may be adjusted to set the overall gain to any desired value). Similarly, the left signal is cancelled from the right channel. With the values shown, the left signal will have a gain of ½ to the left output L′ and the right signal will have a gain of ½ to the right output R′. Buffer amplifiers A501 and A502 may be made to have a gain of 2 to compensate for this, or resistors R515 and R516 may be made 100K each to increase the gain to unity.

When the control is moved clockwise, the signal at the RB and LB terminals increases relative to that at the RF and LF terminals, and a proportion of right signal is introduced in antiphase into the left channel output and vice versa. Moving the control counterclockwise causes the right signal to be introduced into the left amplifier in phase, and the left signal into the right amplifier similarly.

When the potentiometer is in the fully counterclockwise position, the left signal is applied as follows: via resistor R508 directly into amplifier A505; via potentiometer R501A into the junction of resistors R512 and R503, half of the current through potentiometer R501A going into each of these resistors. With the values shown, if a 1-volt signal is applied to terminal L, the signal at LF will be 1 volt also, and that at LB will be ⅓ volt. The output of the left channel L′ will be ⅔ volt, and that of the right channel R′ will be ⅓ volt, as the signal through the resistor R511 is partially cancelled by that through the resistor R507. Similarly, the right signal of 1 volt appears as ⅔ volt at the right output R′ and ⅓ volt at the left output L′. This represents a −6 dB blend between the left and right channels. When the control is fully clockwise, a similar degree of antiphase blend is present at the output terminals L′ and R′. The extreme proportion of blend introduced may be changed by choosing the value of dual potentiometer R501A/R501B differently, smaller values giving greater degrees of blend at the extreme positions of the control.

In the car radio version of FIG. 13 wherein amplifiers A501 and A502 and dual potentiometer R501A and R501B are not present and the input terminals are LF, LB, RF and RB and are driven from the corresponding radio outputs, in the fully counterclockwise or front position of the fader control, the two back inputs will produce no output and both amplifiers A506 and A505 will receive the sum of LF+RF, a mono signal. This signal will of course appear in both front speakers, or in the center front speaker only if one is used in the ca installation. This position is of benefit when the car is moving through an area of poor FM reception and does not have a manual mono reception switch, as it will alleviate the undesirable phenomenon of "picket-fencing" noise bursts which are particularly offensive when reproduced with a surround-sound system.

As the fader/panorama control is rotated clockwise, the stereo separation will increase, allowing normal stereophonic reception to occur before significant levels are passed to the rear loudspeakers. As the control is further rotated, the normal surround sound presentation will occur at the central position, near which the control will act much like a conventional fader.

When the control is moved fully clockwise, a position that is unlikely to be particularly useful, the signals applied to the output amplifiers A505 and A506 will be LB−RB and RB−LB respectively, i.e., the difference of the stereo channels at equal levels in antiphase. The decoder will reproduce these in the rear speakers as a monophonic signal, which will, however, have almost complete cancellation of the center front source location, where most vocals are placed in stereophonic music, and a monophonic signal will also be cancelled.

Referring now to FIG. 14, which shows a variable matrixing means according to the present invention, this figure also includes certain elements discussed previously, the lower section being identified by the numerals 46, 42 and 44, as this section contains elements of the low-pass filters in block 42, the input matrix block 44 and the voltage controlled amplifiers of block 46 of FIG. 2.

In the upper section of FIG. 14 is shown a detailed implementation of the output matrix 48, comprising amplifiers A301 through A306 and associated components therewith.

In this embodiment of the variable matrixing means 48 of a surround processor which employs only front-back sensing and control, the matrix coefficients have been optimized to have 16 dB out-of-phase blend between the front channels and 8 dB out-of-phase blend in the rear channels. This has proven to give the most satisfactory audible performance with the majority of musical inputs. It helps to reduce center front predominance when there is no significant logic action occurring. In the quiescent state of the logic, as will be explained below, a small residual level of attenuation is provided in the front VCA 74 to provide this blend in the front channels.

The left and right audio signals are applied to terminals L′ and R′ respectively. Two resistors of typically 200K feed the input summing junction of a two-pole low-pass filter 70 somewhat like that shown in FIG. 9, corresponding with R11 of FIG. 9. R10 and C10 of FIG. 9 are not used in the two pole filter. The output of this filter is inverted by inverter 72, corresponding with OA4 in FIG. 9, but the functions of low-pass filtering and inversion are combined in the circuit of FIG. 9 and shown separately here for clarity. The output signal of inverter 70 is −0.5(L″+R″) being equivalent to summing the outputs of low-pass filters in left and right channels and containing low frequencies only.

Resistors of 100K each couple left and right inputs into the summing junction of the VCA labeled 74, which receives the front control signal Vcf. Another resistor, of typically 61.9K, couples the low-pass filtered signal from inverter 72 into this junction, partially cancelling the L′+R′ input into this point at low frequencies. If the value of this resistor were 49.9K, this cancellation would be complete, but with the value shown, the low-frequency component is −0.81(L′+R′), so that the net input to this VCA is 0.19(L′+R′) at low frequencies, about 15 dB less than at midrange and upper frequencies. Actually, the filter characteristic used has a slight gain at frequencies just below its cutoff frequency so that the cancellation is complete in this region. This particular configuration of the filter achieves a higher initial slope than for a maximally flat two-pole filter, although the latter characteristic can also be used and the resistor values adjusted appropriately, as will be apparent to those skilled in the art.

The output of VCA 74, labeled FC, is the front cancellation signal for the decoder matrix. This VCA is of the type shown in FIG. 12, but has inputs from L′, R′ and the low-pass filter 72 as discussed above. With reference to FIG. 12, the three resistors just discussed correspond with R5A, R5B and a third resistor R5C, of 61.9K, not shown in FIG. 12, for the low-pass filter input. Corresponding to R1A and RIB there is also a third resistor R1C, of 124K, from the low-pass filter input to the junction of resistors R1A and R1B in this VCA. Other differences from FIG. 12 are that resistor R4 is comprised of a fixed resistor of 56.2K in series with a 10K variable resistor, the resistor R6A has a value of 52.3K and the variable resistor R6B is 10K.

In adjusting the performance of this VCA 74, with reference also to FIG. 12, variable resistor R6B is adjusted for complete cancellation of front signal in the left (LF) and right front (RF) outputs when equal in-phase signals are applied to L and R inputs of the decoder; then with a signal applied to L or R only (the detector and both front and back control voltage outputs being zero in this condition) the position of potentiometer R9 is set so that the attenuation of signal through amplifier OA1 is about 0.5 dB below the minimum attenuation (the FET Q1 being just turned on) and the value of resistor R4 has been chosen or made adjustable so that the signal at terminal E2 is not quite fully cancelled out. As will be seen later, the amount of residual signal is chosen to provide the antiphase cross-blending referred to earlier in the LF and RF output channels of the variable matrixing means 48.

Inputs L′ and R′ are also applied to inverters 84 and 82 respectively, their output signals being labeled −L′ and −R′, respectively. The L′ and −R′ signals are applied via two −100K resistors to a VCA labeled 76, which receives the back control voltage Vcb. This VCA is substantially as shown in FIG. 12, these resistors being identified with R5A and R5B of FIG. 4. The output of VCA 76 is the back cancellation signal labeled BC. This is coupled to low-pass filter 78, of similar type to filter 70, and inverter 80, these two components once again comprising an inverting two-pole filter of the type shown in FIG. 9, omitting resistor R10 and capacitor C10.

Both two-pole filters are identical and with reference to FIG. 9, specific values of the resistors and capacitors to achieve the response specified are: resistors R11, R12, R13 all 100K; capacitor C11, 68 nF; capacitor C12, 6.8 nF. Other variations of these filter values which will provide the same frequency response can by achieved by multiplying all the resistor values by a constant and dividing the capacitors by the same constant, while varying the resistors or capacitors only will adjust the cut-off frequency, as will be apparent to those skilled in the art. It is important to match the two filter characteristics, however, so that typically these resistors are of 1% tolerance and the capacitors are matched to better than 2%.

This part of the circuitry of FIG. 11 so far described thus generates signals L', R', −L', −R', FC, BC and −BLF, which are applied to the output matrix 48 comprising amplifiers A301 through A306 and associated resistors and capacitors, the function of which will now be described.

Amplifier A301 receives the L', FC, BC and −BLF signals through resistors of typically 42.2K each. It corresponds in effect to amplifier OA5 of FIG. 6. In this amplifier, the sum of L', FC, BC and −BLF is generated.

The feedback resistor, of typical value 49.9K, provides negative feedback around A301, setting the voltage gain to −1.182 for each of these components. Thus the output of this amplifier, labeled LF, which is applied via a further inverting amplifier to the left front loudspeaker, is described by:

$$LF = 1.182\ (L' + FC + BC - BLF)$$

When a pure left or right signal is present at the decoder inputs, signals BC and −BLF are both zero. Signal FC is set to a level of −0.154(L'+R') so that the equation for LF" becomes:

$$\begin{aligned} LF &= -1.182(L' - 0.154(L' + R') - 0.81(L'' + R'')) \\ &= L' - 0.182R' + 0.147(L'' + R'') \end{aligned}$$

incorporating an effective −16 dB out-of-phase crossblend at high frequencies which broadens the stage width somewhat, and at low frequencies there is a bass center front component, which tends to cancel this out-of-phase blend.

When a pure front signal is applied, with L'=R', the signal FC is set to −0.5(L'+R'), so that:

$$LF = 1.182\ (L' - 0.5(L' + R') + 0.405(L'' + R''))$$

in this condition. Thus a complete cancellation occurs at midrange and high frequencies, while the low-frequency output conforms to the response set by the low-pass filter 70, with a voltage gain of almost unity for this signal.

We can regard the front VCA as having a signal input of 0.5(L'+R'−0.81(L"+R") and a gain kf which varies from 0.308 to 1. Similarly, the back VCA has an input of 0.5(L'−R'), but its gain kb varies from 0 to 1. The back VCA output passes through the low-pass filter 78 and inverter 80, as previously mentioned, so that this filter output is 0.405 kb (L"−R"). Then the general equation for the voltage gain of the LF channel to the input signals is:

$$\begin{aligned} LF = &-1.182(L' - 0.5\ kf(L' + R' - \\ &0.81(L'' + R'')) - 0.5\ kb(L' - \\ &R' - 0.81(L'' - R''))) \end{aligned}$$

Similarly, amplifier A302 receives the signals R' and FC to its inverting input and signals BC and −BLF via 42.2K resistors to its noninverting input, with a feedback resistor of 49.9K as for the LF channel. The balancing resistor from the noninverting input to ground is chosen so that the noninverting input voltage gain will also be 1.182, and has a value of 49.9K for this reason. The output of this amplifier, at terminal RF, is described by:

$$\begin{aligned} RF &= -1.182(R' + FC - BC + BLF) \\ &= -1.182(R - 0.5\ kf(L' + R' - 0.81(L'' + R'')) + \\ &\quad 0.5\ kb(L' - R' - 0.81(L'' - R'')) \end{aligned}$$

once again including the out-of-phase blend when kf is set at 0.308 in the quiescent state.

The circuitry surrounding amplifier A303 provides an output labeled CF for application to a center front loudspeaker. This amplifier receives input signals L' and R' via 110K resistors to its inverting input, and signal FC via a 49.9K resistor and the parallel network comprising a 4.99K resistor and a 0.0018 uF capacitor in series to its noninverting input. The feedback resistor is 49.9K as before. The feedback loop also includes a series RC network comprising a 39.2K resistor and a 680 pF capacitor in parallel with this resistor. This has the effect of rolling off the high-frequency portion of the spectrum. At high frequencies, the voltage gain of amplifier A303 is reduced by about 7 dB relative to mid frequencies. At mid frequencies, its voltage gain to L' or R' is 0.454, or about −7 dB, and at high frequencies its voltage gain is 0.2.

The mid-frequency voltage gain of amplifier A303 to the FC signal is 0.625, but this rises to 1.179 at high frequencies. The signal at output terminal CF may be described at low and mid frequencies by:

$$CFmid: -0.454(L' + R') - 0.312\ kf\ (L' + R' - 0.81(L'' + R''))$$

and at high frequencies by:

$$CFhi = -0.2\ (L' + R') - 0.59\ kf\ (L' + R')$$

Thus when kf=1, as for a center front input signal, the response curve is approximately flat for the L'+R' signal, and when kf=0.308 (quiescent) the voltage gain to L'+R' is 0.55 at mid frequencies falling to 0.384 at high frequencies. This response has been found to improve mid-frequency separation when left or right signals are present in the absence of front signals.

Amplifier A304 with its components provides the left back signal LB. This amplifier receives input signal L' via a resistor of 56.2K, signal −R' via a 215K resistor and signal FC via 76.8K resistor, to its inverting input. It receives signal BC via an network comprising a 110K resistor in parallel with a 39.2K resistor and a 470 pF capacitor in series. The −BLF signal is not provided to this point, so that back enhancement operates down to low frequencies. Once again, the feedback network includes a roll-off at high frequencies, provided by an 82K resistor and a 270 pF capacitor in series, in parallel with a 49.9K feedback resistor. The balancing resistor at the inverting input is 22.1K.

At mid frequencies, this amplifier has a voltage gain of −0.889 to L', −0.232 to −R', and −0.665 to FC. It also has a voltage gain of 0.466 to signal BC. This yields the LB signal as:

$$LBmid=-0.889(L'-0.261R')+0.332\,kf(L'+R'-0.81(L''+R'))-0.233\,kb\,(L'-R')$$

When kf=0.308 and kb=0, the quiescent state, this simplifies to:

$$LBmid=-0.787(L'+0.334R'-0.083(L''+R''))$$

and at high frequencies, the LB signal is given by:

$$LBhi=-0.553\,(L'-0.261R')+0.207\,kf\,(L'+R')-0.457\,kb\,(L'-R')$$

as voltage gains to L', −R', FC are reduced to −0.553, −0.144, and 0.414 and the voltage gain to signal BC is increased to 0.914. With kf=0.308 and kb=0 (quiescent) this reduces to:

$$LBhi=-0.489L'+0.206R'$$

When kf=0 and kb=1, (full center back signal) the LB channel output is represented by $$LBmid=-1.122L'+0.465R'$$

and $$LBhi=-1.01L'+0.601R'$$

The RB channel amplifier A305 receives signal R' via a 56.2K resistor, signal −L' via a 215K resistor, signal FC via a 76.8K resistor, and a signal BC via a 110K resistor and the series network comprising a 49.9K resistor and a 470 pF capacitor. The feedback network again comprises a 49.9K resistor, in parallel with the series network of an 82K resistor and a 270 pF capacitor. As for the LB channel, the mid frequency voltage gains of this amplifier are −0.889 to signal R', −0.232 to signal −L' and −0.665 to signal FC, and the voltage gain to signal BC is −0.454. At high frequencies, these voltage gains change to −0.552, −0.144, −0.414 and −0.904, respectively. These are marginally different in magnitude from the corresponding voltage gains for the LB channel, but only because of selecting nearest preferred values of the resistors. The RB output signal is described by:

$$RBmid=-0.889\,(R'-0.261L')+0.333\,kf\,(L'+R'-0.81(L''+R'))+0.227kb(L'-R')$$

and $$RBhi=-0.552\,(R'-0.261L\,)+0.207\,kf\,(L'+R')+0.452\,kb\,(L'-R'')$$

With kf=0 308 and kb=0 (quiescent) these reduce to:

$$RBmid=-0.786R'+0.334L'-0.083(L''+R'')$$

$$RBhi=-0.488R'+208L'$$

and with kf=0 and kb=1 (center back) they reduce to:

$$RBmid=-1.116R'+0.459L'$$

$$RBhi=-1.004R'+0.596L'$$

Amplifier A306 of FIG. 14 with its associated components generates the center back feed signal CB. This amplifier receives signal R' via a 100K resistor, signal −L' via a 100K resistor and signal BC via a 121K resistor and the series RC network comprising a 59K resistor and a 390 pF capacitor, with feedback again provided by a 49.9K resistor in parallel with the series RC network of an 82K resistor and a 270 pF capacitor.

The voltage gain of amplifier A306 to signals −L' and R' is −0.501, and to signal BC is −0.416 at mid frequencies. At high frequencies, the voltage gains output signal can be described by:

$$CBmid=-0.501(R'-L')+0.208\,kb\,(L'-R')$$

$$CBhi=0.31(R'-L')+0.392\,kb\,(L'-R')$$

When kb=1 (center back) this becomes:

$$CBmid=0.709(L'-R')$$

$$CBhi=0.702(L'-R')$$

which gives an essentially flat response. When the signal is predominantly front, however, high frequencies are rolled off, as in the other back channels. The roll off in these back channels helps to reduce dialog breakthrough into the rear, especially the high-frequency sibilant sounds.

In summary, the matrix of FIG. 14 really provides three-band processing, as the high-frequency region uses different matrixing from the mid-frequency region, and the low-frequency region uses very little logic derived processing at all. There is a little, only because the FC signal does not completely cancel out at bass frequencies.

Figure 15:
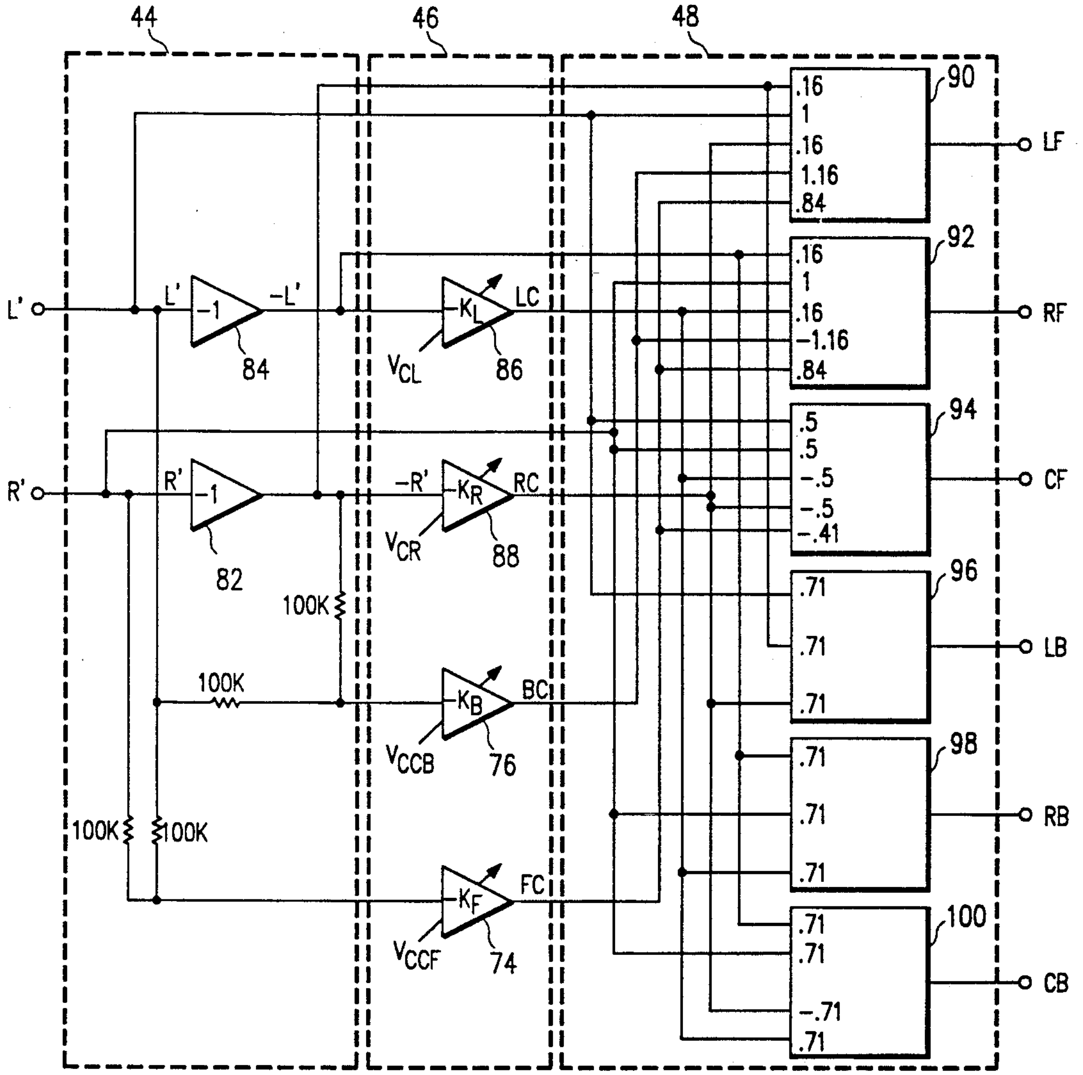
FIG. 15 is a schematic block diagram of a preferred embodiment of the output matrix for the processor of FIG. 2.

FIG. 15 shows a second embodiment of the variable matrixing means suitable for use with the extended control voltage generator which produces all four of the control signals shown in FIG. I and FIG. 2.

In FIG. 15, which describes the midrange processing only, the circuitry is generally similar to that of FIG. 14, but the op-amps have been shown as summing networks with the coefficients indicated, and the active processing includes four VCA circuits instead of two. The VCA block 46 and output matrix block 48 and a portion of the input matrix block 44 are indicated by broken outlines. Because some matrixing functions are switched in this processor depending on user-selected options, where negative coefficients are implemented, this is usually done by means of an inverter amplifier, and all of the summation of signals is then done in inverting summing amplifiers configured generally like A301 in FIG. 14.

As in FIG. 14, inputs L' and R' receive left and right signals, which are inverted by inverting amplifiers 84 and 82, respectively. The outputs from these amplifiers, labeled −L' and −R', are processed by VCAs labeled 86 and 88 respectively, which receive and are controlled by control signals Vcl and Vcr, respectively. Again as in FIG. 14, two 100K resistors sum L' and R' signals into the input of center front VCA labeled 74, and two 100K resistors sum L' and −R' into the back VCA labeled 76. As in FIG. 14, these two VCAs are controlled by control signals Vcf and Vcb respectively. The new control voltages Vcl and Vcr are derived from additional detector circuitry similar to that shown in FIGS. 5-7. It will be apparent to those skilled in the art how these circuits are constructed, and therefore no corresponding figure has been included here to demonstrate this aspect of the invention.

The low-frequency components of FIG. 14 have been omitted from FIG. 15, but in a practical application, the low-pass filters and inverters would also be present in the circuitry for the reasons stated previously. In this case, the bass filtering is done before the VCAs as indicated in FIG. 2.

In the summing amplifiers of FIG. 15, shown as boxes 90 through 100, which correspond respectively with amplifiers A301 through A306 of FIG. 14 and their associated components, only mid frequency coefficients are shown. A difference between FIG. 15 and FIG. 14 is that in the circuit of FIG. 15, both kf and kb are set to zero in the quiescent state, and the out-of-phase blend is therefore provided explicitly by adding 0.16 of −R' to L' at the input of the LF summing amplifier in block 90 and similarly adding 0.16 of −L' to R' in the RF summing amplifier input of block 92. These are cancelled out by the cancellation signals from VCAs 86 and 88 as required by the left-right sensing circuitry. Thus the third input to LF processing block 90 is R' multiplied by 0.16 kr, which cancels out the −0.16R' input when kr=1, and similarly there is a 0.16 kl L' signal applied to the input of RF processing block 92 to cancel out the −0.16L' signal when kl=1.

The back VCA 76 has an output of −0.5 kb (L'−R') in this embodiment of the processor (resistors in the detailed VCA circuit of FIG. 12. being optimized for this condition). Since the main inputs to LF processing block 90 with this signal total 1.16, the coefficient of 1.16 for signal BC effectively cancels this signal out. For the RF processing block 92, the corresponding BC coefficient has to be −1.16. Similarly, a coefficient of 0.84 for the FC signal out of the front VCA 74, which is −0.5 kf (L'+R'), causes it to cancel in the LF processing circuit 90. The corresponding coefficient in the RF processor 92 is also 0.84. It should be noted that unlike FIG. 14, kf for this embodiment varies from 0 to 1.

We can therefore write the following equations to define the midrange processing for LF and RF:

$$LFmid = L' - 0.16R' + 0.16\ kr\ R' - 0.58\ kb\ (L' - R') - 0.42\ kf\ (L' + R')$$

$$RFmid = R' - 0.16L' + 0.16\ kl\ L' + 0.58\ kb\ (L' - R') - 0.42\ kf\ (L' + R')$$

As mentioned previously, the center front output and loudspeaker can be switched out of circuit in some embodiments of this surround processor, in which case the cancellation of the FC signal in the left front and right front summing blocks 90 and 92 would be turned off by means of a switch.

The CF processing in block 94 adds 0.5(L'+R') and then cancels out the L' or R' signal component when it is predominant in the mix by adding −0.5 kl L' and −0.5 kr R'. Also, the front signal FC is added in at an increased level, whenever CF is predominant, by adding −0.41 FC, since FC is an inverted output −0.5 kf (L'+R'). This provides a 3 dB gain increase for a center front signal, to compensate for its cancellation out of the left front and right front outputs. Thus, the equation for the CF processor is:

$$CFmid = 0.5\ (L' + R') - 0.5\ kl\ L' - 0.5\ kr\ R' + 0.205\ kf\ (L' + R')$$

In the left back processor block 96 and the right back processor block 98, there is a difference from FIG. 13. Both channels receive equal proportions of the L' and −R' or −L' and R' signals, so that front dialog is automatically cancelled without an FC cancellation signal being required. When L' signal alone is present, the −R' signal applied to block 96 is cancelled out, and when R' alone is present, the −L' signal is cancelled in the block 98, so that the opposing channel is removed from the speaker in each case. These channels can be described by:

$$LBmid = 0.71\ (L - R') + 0.71\ kr\ R'$$

$$RBmid = 0.71\ (R' - L') + 0.71\ kl\ L'$$

The center back channel processor in block 100 comprises L' and −R' inputs, and a cancellation path from each of the L' and R' signals which cancels out the L' signal when it predominates and vice versa. The equation for CB is:

$$CBmid = 0.71\ (R' - L') + 0.71\ kl\ L' - 0.71\ kr\ R'$$

When the center back output terminal of the entire surround processor is omitted, a proportion of 0.71 of this signal is added into the left back and right back outputs subsequently to this output matrix processing, in additional summing amplifier circuitry not shown, to allow for flexibility in configuring the overall surround processor design.

These relationships can be summarized in a table showing the outputs for each of the four control voltages going high. For comparison, Table I also shows the outputs when the logic is turned off, so that all the k's are zero.

TABLE I

| Effect of logic action on outputs of adders. | | | | | | | | |
|---|---|---|---|---|---|---|---|---|
| Channel | L | R | L | R | L | R | L | R |
| Source: | 0.707 | 0.707 | 0 | 1 | 0.707 | − 0.707 | 1 | 0 |
| Condition: | kf = 1 | | kr = 1 | | kb = 1 | | kl = 1 | |
| OUTPUTS: | | | | | | | | |
| LFmid | 1.42L + 0.026R | | L | | 0.42L − 0.42R | | L − 0.16R | |
| logic on: | 0 | | 0 | | 0 | | 1 | |
| logic off: | 0.594 | | −0.16 | | 0.82 | | 1 | |
| RFmid | 1.42R + 0.26L | | R − 0.16L | | 0.42R − 0.42L | | R | |
| logic on: | 0 | | 1 | | 0 | | 0 | |
| logic off: | 0.594 | | 1 | | −0.82 | | −0.16 | |

TABLE I-continued

Effect of logic action on outputs of adders.

| Channel | L | R | L | R | L | R | L | R |
|---|---|---|---|---|---|---|---|---|
| Source: | 0.707 | 0.707 | 0 | 1 | 0.707 | − 0.707 | 1 | 0 |
| Condition: | kf = 1 | | kr = 1 | | kb = 1 | | kl = 1 | |
| CFmid | 0.705L + 0.705R | | 0.5L | | 0.5L + 0.5R | | 0.5R | |
| logic on: | 0.997 | | 0 | | 0 | | 0 | |
| logic off: | 0.707 | | 0.707 | | 0 | | 0.707 | |
| LBmid | 0.707L − 0.707R | | 0.707L | | 0.707L − 0.707R | | 0.707L − 0.707R | |
| logic on: | 0 | | 0 | | 1 | | 0.707 | |
| logic off: | 0 | | −0.707 | | 1 | | 0.707 | |
| RBmid | 0.707R − 0.707L | | 0.707R − 0.707L | | 0.707R − 0.707L | | 0.707R | |
| logic on: | 0 | | 0.707 | | −1 | | 0 | |
| logic off: | 0 | | 0.707 | | −1 | | −0.707 | |
| CBmid | 0.707R − 0.707L | | −0.707L | | 0.707R − 0.707L | | 0.707R | |
| logic on: | 0 | | 0 | | −1 | | 0 | |
| logic off: | 0 | | 0.707 | | −1 | | −0.707 | |

In the full circuitry of this embodiment, it has been found advantageous to provide an additional input to LB processor block 96 from the output of the R′ low-pass filter, R″, with a coefficient of −0.71, to cancel the signal −R′ applied with coefficient 0.71 as shown and, similarly, to apply 0.71 L″ to the RB processor block 98. These two bass cancellation signals force the bass to be in phase in all speakers, which has been found audibly preferable. The requirement for these additional inputs also dictates the positioning of the bass filters 42 ahead of input matrix block 44.

Figure 17:
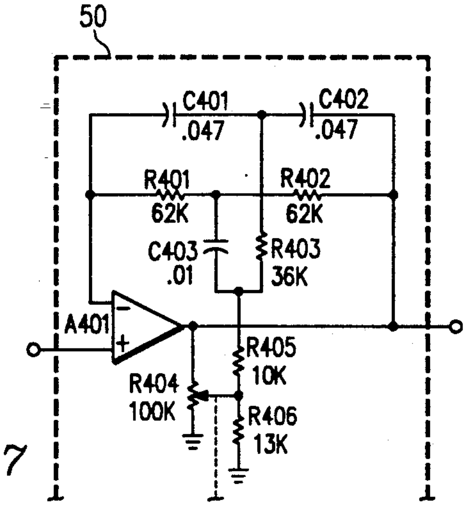
FIG. 17 is a detailed schematic diagram of an improved single element controlled twin-T notch filter providing a variable bass equalizer as embodied in the processor of FIG. 2.

An improved bass equalizer circuit 50 according to another aspect of the invention is shown in FIG. 17. This employs a twin T network in the feedback loop of an operational amplifier. The purpose of this equalizer is to improve the apparent low-frequency response of the surround processor when used with loudspeakers of types not having extended low-frequency response.

Figure 16:
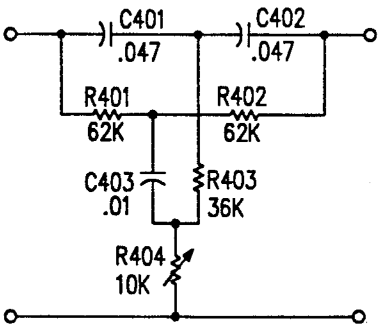
FIG. 16 (PRIOR ART)
FIG. 16 is a detailed schematic diagram of a single-element controlled twin T notch filter according to the prior art.

FIG. 16 shows a twin T network according to the applicant's prior art U.S. Pat. No. 3,883,832, which may, as stated in that patent, be applied in the feedback loop of an operational amplifier to provide a variable bass boost at an adjustable center frequency. The twin-T network comprises capacitors C401, C402, C403 and resistors R401, R402 and R403, in a standard configuration known to those skilled in the art. Potentiometer R404 varies both the center frequency and the notch depth simultaneously, or when applied in the feedback loop of an operational amplifier R404 varies the center frequency and the amount of bass boost.

In the circuit of FIG. 17, an identical twin-T network comprising resistors R401, R402 and R403 and capacitors C401, C402 and C403 is placed in the feedback loop of an amplifier A401, but instead of using a simple variable resistor as in FIG. 16 to vary the degree of boost and the center frequency, the improved circuit uses a potentiometer R404 from the output of operational amplifier A401 to ground, with a linearizing resistor R406 across the lower section, the wiper of potentiometer R404 being connected via a third resistor R405, to the shunt arm of the twin-T network. This circuit applies to block 50 of FIG. 2 as indicated by the broken outline.

The advantage of this method of control over the prior art method is that the equalizer action can now be turned fully off, which happens when the wiper of potentiometer R404 is at the upper end of this potentiometer, and the control law is closer to linear without using a tapered potentiometer.

Within the scope of the present invention, the bass equalizer according to this invention is typically applied to left front and right front outputs, employing a dual-ganged potentiometer, as shown in FIG. 2. It could also be applied to more channels, using a multiple-ganged potentiometer with an appropriate number of sections.

Modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. Apparatus for the periphonic reproduction of sound on a plurality of loudspeakers derived from audio input signals containing varying directional information, said apparatus comprising:

input matrix means for providing a plurality of combination signals from said input signals;

variable matrixing means responsive to one or more control voltage signals for matrix decoding of said combination signals to produce a plurality of output signals corresponding to said plurality of loudspeakers for said reproduction of sound, said combination signals being recombined in fixed and varying proportions with said varying proportions being varied in response to said control voltage signals;

detector means for providing one or more directional information signals from said input signals; and means for smoothing said directional information signals with continuously variable time constants to generate said one or more control voltage signals, said means for smoothing being responsive to both the rate of change and amplitude of said directional information signals, such that as the difference between said control voltage signals and said directional information signals increases, the value of said time constants decreases to permit said control voltage signals to closely follow said directional information signals, and as the difference between said control voltage signals and said directional information signals decreases, the value of said time constants increase so that variations in said control voltage signals are smooth.

2. The apparatus according to claim 1 wherein for each said directional information signal, said smoothing means comprises:

variable low-pass filter means for generating a variable time constant for smoothing said directional information signal to provide one of said control voltage signals;

differential amplifier means for comparing the output signal from said variable low-pass filter means with said directional information signal and producing a difference signal proportional to the difference therebetween;

absolute value means for generating an absolute value signal proportional to the absolute value of said difference signal; and second amplifier means for applying said absolute value signal from said absolute value means to control said variable low-pass filter means for decreasing said time constant when said absolute value signal increases, and increasing said time constant when said absolute value signal decreases.

3. The apparatus according to claim 2 further comprising for each directional information signal an absolute magnitude comparator for comparing said directional information signal with a fixed reference voltage and for increasing the gain of said second amplifier means whenever the magnitude of said directional information signal exceeds said reference voltage, thereby increasing the loop gain of said smoothing means.

4. The apparatus according to claim 2 wherein each of said variable low-pass filter means comprises:

first and second resistors connected in series to a capacitor for generating a time constant and for applying said time constant to said directional information signal;

buffer amplifier means for buffering the voltage on said capacitor for providing one of said control voltage signals;

electronic switch means connected in parallel with one of said first and second resistors for at times bypassing said one resistor, such that when said switch means is active said one resistor is bypassed and said time constant is relatively short, and when said switch means is inactive said one resistor is not by passed and said time constant is relatively long; and pulse width modulated oscillator means for driving said switch means between said active and inactive states such that the duty cycle of said pulse width modulated oscillator means may be varied to vary the proportion of time said switch means is active, thereby varying the value of said time constant.

5. The apparatus according to claim 3 wherein said second amplifier means has at least two alternative gain values selected by means of an electronic switch means, which is controlled by said absolute magnitude comparator means.

6. The apparatus according to claim 2 wherein one or more inverting amplifiers are further provided for inverting one or more of said control voltage signals to provide inverted control voltage outputs which vary in the opposite direction to said control voltage signals.

7. The apparatus according to claim 6 wherein the directional information contained in said audio input signals corresponding to said control voltage signal and said inverted control voltage signal are center back and center front, respectively.

8. The apparatus according to claim 6 wherein the directional information contained in said audio input signals corresponding to said control voltage signal and said inverted control voltage signal are right and left, respectively.

9. The apparatus according to claim 3 wherein said absolute magnitude comparator means includes means for preventing the output signal thereof from switching the gain of said second amplifier means to a reduced value when said directional information signal applied thereto changes from a large positive value to a large negative value or vice versa in a relatively short time, but permits the gain of said second amplifier means to be reduced to a lower value when said directional information signal is varying between relatively smaller absolute magnitudes larger than said fixed-reference voltage signal.

10. The apparatus according to claim 1 wherein said smoothing means for each directional information signal comprises:

variable low-pass filter means for generating a variable time constant for smoothing said directional information signal to provide one of said control voltage signals;

fixed time constant means for generating a fixed time constant for smoothing said directional information signal;

differential amplifier means for comparing the output signals from said variable low-pass filter means and said fixed-time constant means, and producing a difference signal proportional to the difference therebetween;

absolute value means for generating an absolute value signal proportional to the absolute value of said difference signal; and second amplifier means for applying said absolute value signal from said absolute value means to control said variable low-pass filter means for decreasing said time constant when said absolute value signal increases, and increasing said time constant when said absolute value signal decreases.

11. The apparatus according to claim 1 wherein said detector means comprises one or more log-ratio detector circuits.

12. The apparatus according to claim 1 further comprising autobalancing means for automatically balancing said audio input signals.

13. Split-band processing apparatus for the periphonic reproduction of sound on a plurality of loudspeakers derived from audio input signals containing varying directional information, said apparatus comprising:

input matrix means for providing a plurality of combination signals from said audio input signals;

variable matrixing means responsive to one or more control voltage signals for matrix decoding of said combination signals to produce a plurality of output signals corresponding to said plurality of loudspeakers for said reproduction of sound, said combination signals being recombined from a direct signal path in fixed proportions and from a cancellation signal path in varying proportions, with said varying proportions being varied in response to said control voltage signals;

means for generating said control voltage signals from said audio input signals; and band splitting means for precluding low-frequency components of said audio input signals from passing through said cancellation path, said band splitting means including a plurality of low-pass filtering means having inputs and outputs for passing a defined band of low frequencies, and a corresponding plurality of subtraction means each having inputs and an output for subtracting the output signal of said low-pass filtering means from the input signal thereof to provide at its output a corresponding signal from which low frequency components have been removed.

14. The apparatus according to claim 13 further comprising band-pass filtering means for passing only mid-frequency components of said audio input signals to said means for generating said control voltage signals from said audio input signals.

15. The apparatus according to claim 13 wherein the output signals from said low-pass filtering means are also combined via said direct signal path in said variable matrixing means such that a portion of said low-pass filtered signals is subtracted from one or more of said loudspeaker signals.

16. The apparatus according to claim 13 wherein said subtraction means is included in said input matrix means.

17. The apparatus according to claim 13 wherein said subtraction means is included in said variable matrixing means.

18. The apparatus according to claim 13 wherein said variable matrixing means comprises a plurality of voltage-controlled amplifiers corresponding to the number of said control voltage signals and a plurality of summing amplifiers corresponding to the number of said output signals for driving said loudspeakers.

19. The apparatus according to claim 18 wherein said low-pass filtering means is after said input matrix means and said subtraction means is provided in said cancellation path prior to said voltage controlled amplifiers.

20. The apparatus according to claim 18 wherein said low-pass filtering means and subtraction means are provided in said cancellation path after said voltage-controlled amplifiers.

21. The apparatus according to claim 14 wherein said band pass filtering means comprises a filter characteristic approximately inverse to a Fletcher-Munson curve.

22. Apparatus for the periphonic reproduction of sound on a plurality of loudspeakers derived from audio input signals containing varying directional information, said apparatus comprising:

input matrix means for providing a plurality of combination signals from said audio input signals;

means for generating one or more control voltage signals from said audio input signals representing said directional information contained therein; and variable matrixing means responsive to one or more control voltage signals for matrix decoding of said combination signals to produce a plurality of output signals corresponding to said loudspeakers for said reproduction of sound, said output signals being recombined from a direct path in fixed proportions and from a cancellation path in varying proportions with said varying proportions being varied in response to said control voltage signals, said variable matrix means including a plurality of summing means equal to said plurality of output signals, and one or more voltage-controlled amplifier means corresponding to each of said control voltage signals.

said voltage-controlled amplifier means including an input terminal for receiving one of said combination signals;

voltage-controlled attenuator network connected to said input terminal and having an output terminal and a control terminal, said control terminal receiving one of said control voltage signals for controlling the attenuation of said network;

inverting amplifier means connected to the output terminal of said network, and summing amplifier means having a first direct input and a second said chain input, said first direct input being connected to said input terminal for receiving said combination signal therefrom, and said second side chain input being connected to the output of said inverting amplifier means, the output terminal of said summing amplifier means being the output terminal of said voltage-controlled amplifier means, such that when said network has infinite attenuation, said combination signal applied to said input terminal and then to said first direct input of said summing amplifier means is passed unattenuated through said summing amplifier means, and when said network has minimum attenuation, the signal applied to the second side chain input of said summing amplifier means from said input terminal, such that no output voltage appears at the output of said summing amplifier means.

23. The apparatus according to claim 22 wherein said voltage-controlled attenuator network comprises a first series resistor connected between said input terminal and an internal summing junction;

a voltage variable resistor means connected between said summing junction and signal ground, and to said control input terminal; and a second series resistor connected between said summing junction and the output terminal, said output terminal being connected the input of said inverting amplifier, said input being at a virtual ground, such that the voltage applied to said control input terminal serves to vary the resistance of said voltage variable resistor means.

24. The apparatus according to claim 23 wherein one or more additional input terminals are provided to receive additional ones of said combination signals, said summing amplifier means being adapted to receive a direct input from each of said additional input terminals, and said network further comprising an additional resistor connected between each said additional input terminal and said internal summing junction.

25. The apparatus according to claim 23 wherein said voltage variable resistor means is a field effect transistor.

26. The apparatus according to claim 23 wherein a capacitor is included between said internal summing junction between said first and second series resistors and said voltage variable resistor mean for isolating direct voltage components therebetween.

27. The apparatus according to claim 25 wherein the control input to said field-effect transistor is linearized by applying one half of its drain voltage to the gate thereof and is biased by means of a potentiometer such that in the quiescent condition when the control voltage applied is zero, said field-effect transistor is just biased to its pinch off voltage, such that the output of said voltage-controlled amplifier means becomes zero, whereby the noise contributed by said field-effect transistor is negligible; and when said control voltage reaches its maximum, said field-effect transistor has minimum resistance, thereby causing a high attenuation through said voltage-controlled attenuator network, so that the signal applied to said second input of said summing amplifier is relatively small, and very little noise is contributed to the output of said summing amplifier means.

* * * * *

UNITED STATES PATENT AND TRADEMARK OFFICE
CERTIFICATE OF CORRECTION

PATENT NO. : 5,172,415

DATED : December 15, 1992

INVENTOR(S) : James W. Fosgate

It is certified that error appears in the above-identified patent and that said Letters Patent is hereby corrected as shown below:

On the title page, item [57] Abstract:

Lines 8-9, please change "controlled" to --control--.

IN THE DRAWINGS:

In the figure at the foot of the title page, the labels "LB" and "RB" should read --RB-- and --LB--, and the labels "18" and "20" should read --20-- and --18--, respectively.

Sheet 1, FIG. 2, the labels "LB" and "RB" should read --RB-- and --LB--, and the labels "18" and "20" should read --20-- and --18--, respectively.

Sheet 2, FIG. 3, polarity marking "+" on amplifier OA6 should read -- - -- and polarity marking "-" should read -- + --.

Column 1, line 66, please change "to" to --Ito--;

Column 6, line 64, "R" should read --R'--;

Column 7, line 42, "LB, LB," should read --LF, LB,--;

Column 7, line 44, "L and R" should read --L' and R'--;

Column 8, line 54, please change "voltage-control" to --control voltage--;

Column 10, line 16, please change "circuitry control" to -- circuitry of control--;

Column 10, line 23, change "directionally" to -- directionality--;

Column 13, line 51, change "voltage control" to --control voltage--;

Column 14, line 11, "(Vcf-Vlr)" should read --(Vcf-Vcr)--;

Column 15, line 54, "ma" should read --may--;

UNITED STATES PATENT AND TRADEMARK OFFICE
CERTIFICATE OF CORRECTION

PATENT NO. : 5,172,415

DATED : December 15, 1992

INVENTOR(S) : James W. Fosgate

It is certified that error appears in the above-identified patent and that said Letters Patent is hereby corrected as shown below:

Column 17, line 44, change "the a split band 1''" to --a split-band processor 1''--;

Column 18, line 14, "ma" should read --may--;

Column 19, line 43, change "VGA" to -- VCA--;

Column 19, line 51, change "VGA" to --VCA--;

Column 27, line 12, change "(L''+R')" to --(L''+R'')--;

Column 27, line 45, after "an" remove paragraph break;

Column 27, line 59, change "L''+R')" to --(L''+R'')--;

Column 27, line 64, change "L'-R'')" to --(L'-R')--;

Column 28, line 1, change "+208L'" to --+0.208L'--.

Signed and Sealed this

Fifteenth Day of March, 1994

*Attest:*

BRUCE LEHMAN

*Attesting Officer*

*Commissioner of Patents and Trademarks*